US012119302B2

(12) United States Patent
Chen

(10) Patent No.: US 12,119,302 B2
(45) Date of Patent: Oct. 15, 2024

(54) SEMICONDUCTOR DEVICE WITH PROTECTION LINERS AND AIR GAPS AND METHOD FOR FABRICATING THE SAME

(71) Applicant: NANYA TECHNOLOGY CORPORATION, New Taipei (TW)

(72) Inventor: Te-Yin Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 396 days.

(21) Appl. No.: 17/698,509

(22) Filed: Mar. 18, 2022

(65) Prior Publication Data

US 2023/0299005 A1 Sep. 21, 2023

(51) Int. Cl.
*H01L 23/535* (2006.01)
*H01L 21/768* (2006.01)
*H01L 23/532* (2006.01)

(52) U.S. Cl.
CPC ...... *H01L 23/535* (2013.01); *H01L 21/76805* (2013.01); *H01L 21/7682* (2013.01); *H01L 21/76843* (2013.01); *H01L 21/76895* (2013.01); *H01L 23/5329* (2013.01)

(58) Field of Classification Search
CPC ........... H01L 21/76805; H01L 21/7682; H01L 21/76843; H01L 21/76895; H01L 21/76885; H01L 23/535; H01L 23/5329; H01L 23/485
See application file for complete search history.

(56) References Cited

U.S. PATENT DOCUMENTS

2014/0308794 A1* 10/2014 Lee ........................ H01L 23/498 438/653
2015/0056801 A1* 2/2015 Park .................... H01L 21/7682 438/655
2015/0126013 A1* 5/2015 Hwang ................ H10B 12/315 438/672
2015/0318243 A1* 11/2015 Lin ................... H01L 21/76843 438/653
2021/0125915 A1* 4/2021 Su ..................... H01L 21/76895

OTHER PUBLICATIONS

Office Action dated on Sep. 23, 2023 related to Taiwanese Application No. 111119312.

* cited by examiner

*Primary Examiner* — Shahed Ahmed
*Assistant Examiner* — Vicki B. Booker
(74) *Attorney, Agent, or Firm* — Xuan Zhang

(57) ABSTRACT

The present application discloses a semiconductor device and a method for fabricating the semiconductor device. The semiconductor device includes a substrate having plurality of contacts, a plurality of composite plugs positioned above the plurality of contacts, a plurality of metal spacers positioned above the substrate; and a plurality of air gaps positioned above the substrate. At least one of the plurality of composite plugs includes a protection liner having a U-shaped profile and a metal plug in the protection liner, and the protection liner is in direct contact with one of the plurality of contacts.

20 Claims, 26 Drawing Sheets

SEMICONDUCTOR DEVICE WITH PROTECTION LINERS AND AIR GAPS AND METHOD FOR FABRICATING THE SAME

TECHNICAL FIELD

The present disclosure relates to a semiconductor device and a method for fabricating the semiconductor device, and more particularly to a semiconductor device with protection liners and a method for fabricating the semiconductor device with protection liner.

DISCUSSION OF THE BACKGROUND

Semiconductor device have applications in many electronic devices, including cellular telephones and other communication devices, automotive electronics, and other technology platforms. With the increased demand for improved functionality and miniaturization in these devices, the dimensions of semiconductor devices are continuously being scaled down to meet the increasing demand of computing ability. However, a variety of issues arise during the scaling-down process and impact the final electrical characteristics, quality, and yield. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate having a plurality of contacts, a plurality of composite plugs positioned above the plurality of contacts, a plurality of metal spacers positioned above the substrate, and a plurality of air gaps positioned above the substrate. At least one of the plurality of composite plugs includes a protection liner having a U-shaped profile and a metal plug in the protection liner, and the protection liner is in direct contact with one of the plurality of contacts.

Another aspect of the present disclosure provides a method for fabricating a semiconductor device including steps of providing a substrate having a plurality of contacts, forming a plurality of composite plugs above the substrate, forming a plurality of metal spacers above the plurality of composite plugs, and forming a plurality of air gaps between the plurality of composite plugs. At least one of the plurality of composite plugs includes a protection liner having a U-shaped profile and a metal plug in the protection liner, and the protection liner is in direct contact with one of the plurality of contacts.

Due to the design of the semiconductor device of the present disclosure, the protection liner protection liners have a function of improving the adhesion between the contact and the metal plug and also a function of suppressing the diffusion of component atoms of the metal plug. In addition, the seams and voids may be reduced when filled high aspect ratio electroplated metal structure of the semiconductor device. Therefore, the electrical transport performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
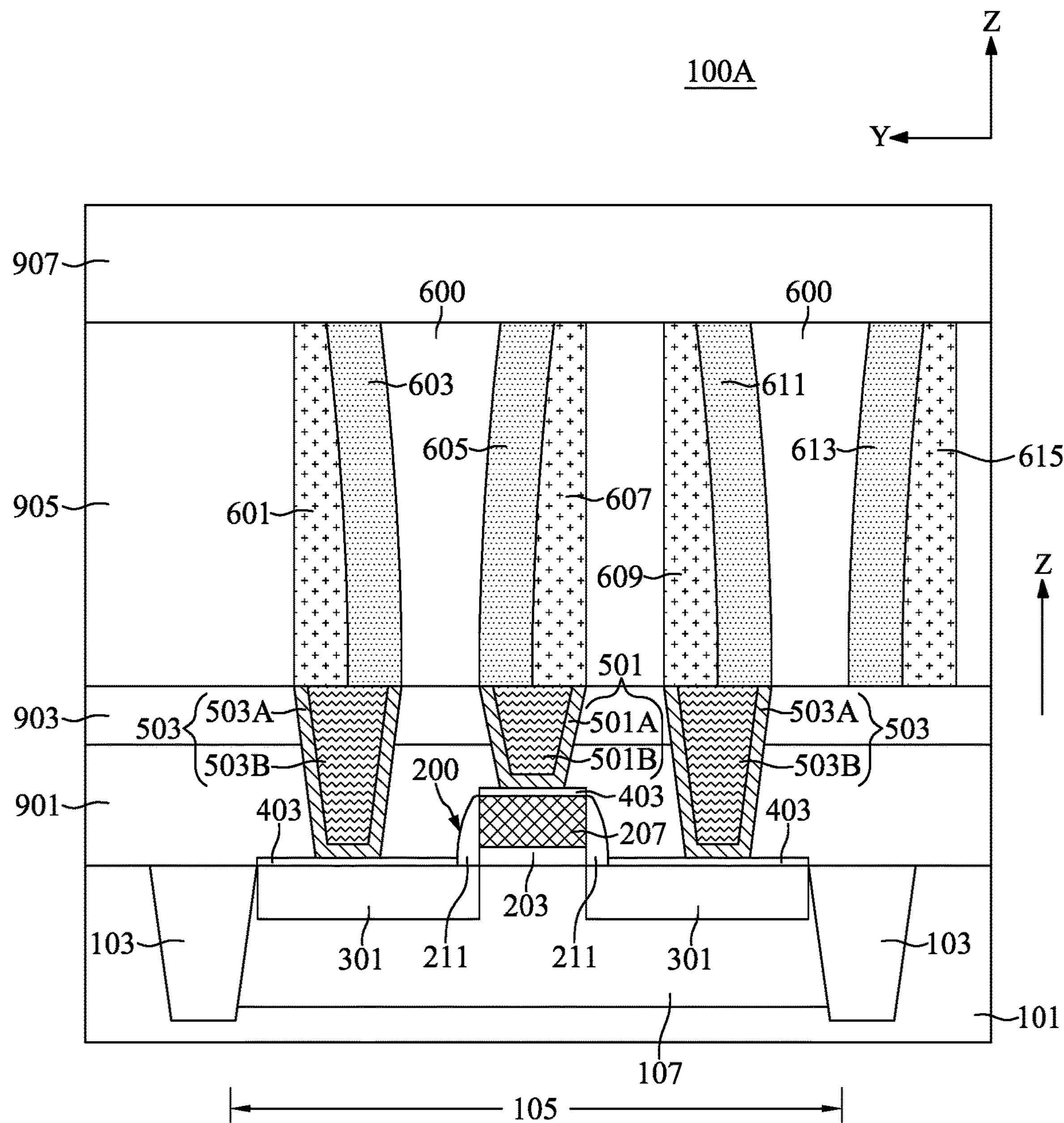
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device in accordance with one embodiment of the present disclosure.

With reference to FIG. 1, in the embodiment depicted, a semiconductor device 100A may include a substrate 101, a plurality of isolation structures 103, an active area 105, a plurality of doped regions, a word line 200, a plurality of contacts 403, a plurality of composite plugs, a plurality of metal spacers, a plurality of air gaps 600, and a plurality of insulating films.

With reference to FIG. 1, in the embodiment depicted, the substrate 101 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, or indium gallium phosphide. When the substrate 101 is formed of silicon-on-insulator, the substrate 101 may include a top semiconductor layer and a bottom semiconductor layer formed of silicon, and a buried insulating layer which may separate the top semiconductor layer and the bottom semiconductor layer. The buried insulating layer may include, for example, a crystalline or non-crystalline oxide, nitride or any combination thereof.

With reference to FIG. 1, in the embodiment depicted, the plurality of isolation structures 103 may be disposed in the substrate 101. The plurality of isolation structures 103 may be formed of, for example, an insulating material such as silicon oxide, silicon nitride, silicon oxynitride, silicon nitride oxide, or fluoride-doped silicate. The plurality of isolation structures 103 may define the active area 105 of the substrate 101.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, in the embodiment depicted, the plurality of doped regions include a first doped regions 107 and a plurality of second doped regions 301. The first doped regions 107 may be disposed in an upper portion of the active area 105 of the substrate 101. The first doped region 107 may be doped by with a dopant such as phosphorus, arsenic, antimony, boron, aluminum or gallium.

With reference to FIG. 1, in the embodiment depicted, the word line 200 may be disposed above the first region 107. The word line 200 may include a gate oxide 203, a poly gate 207, and a plurality of spacers 211. The gate oxide 203 may be disposed on a top of the substrate 101 and under the poly gate 207. The poly gate 207 may be disposed above the substrate 101 and on a top of the gate oxide 203. Both the gate oxide 203 and the poly gate 207 are disposed between the two spacers 211. The plurality of spacers 211 may be disposed on a top of the substrate 101 and adjacent to the sidewalls of the gate oxide 203 and the poly gate 207. The gate oxide 203 may be formed of, for example, silicon oxide, silicon oxynitride, silicon nitride oxide, silicon nitride, or the like. The poly gate 207 may be formed of, for example, polysilicon, or the like. The plurality of spacers 211 may be formed of, for example, silicon oxide, silicon oxynitride, silicon nitride oxide, silicon nitride, or the like.

With reference to FIG. 1, in the embodiment depicted, the plurality of second doped regions 301 may be disposed in the first doped region 107 and respectively disposed between the plurality of isolation structures 103. The plurality of second doped regions 301 may doped with a dopant such as phosphorus, arsenic, antimony, boron, aluminum or gallium.

With reference to FIG. 1, in the embodiment depicted, the plurality of contacts 403 may be disposed respectively on a top of the poly gate 207 and the plurality of second doped regions 301. The plurality of contacts 403 may be formed, for example, cobalt, titanium, tungsten-silicide, or the like.

With reference to FIG. 1, in the embodiment depicted, the plurality of insulating films include a first insulating film 901, a second insulting film 903, a third insulating film 905, and a sealing film 907. The first insulating film 901 may be disposed above the substrate 101 and cover the word line 200 and the plurality of contacts 403. The second insulating film 903 may be disposed on the first insulating film 901. The third insulating film 905 may be disposed on the second insulating film 903. The sealing film 907 may be disposed on the third insulating film 905. The first insulating film 901 and the second insulating film 903 may be formed of, for example, silicon nitride, silicon oxide, silicon oxynitride, undoped silica glass, borosilica glass, phosphosilica glass, borophosphosilica glass, or a combination thereof, but is not limited thereto. The third insulating film 905 and the sealing film 907 may be formed of a same material as the first insulating film 901, but is not limited thereto. The plurality of composite plugs may be disposed above the plurality of contacts 403. The plurality of composite plugs may be disposed passed through the first insulating film 901 and the second insulating film 903. In some embodiments, the plurality of composite plugs may include a first composite plug 501 and two second composite plugs 503. The first composite plug 501 may be disposed on the word line 200. The two second composite plugs may be respectively correspondingly disposed above the plurality of second doped regions 301.

With reference to FIG. 1, in the embodiment depicted, the plurality of metal spacers may be disposed above the substrate 101. The plurality of metal spacers may be formed, for example, aluminum, copper, tungsten, cobalt, or other suitable metal or metal alloy or the like. The plurality of metal spacers may include a first set of metal spacers, a second set of metal spacers, a third set of metal spacers, and a fourth set of metal spacers. The second set of metal spacers may be disposed between the first set of metal spacers and the third set of metal spacers. The third set of metal spacers may be disposed between the second set of metal spacers and the fourth set of metal spacers. The first set of metal spacers may be disposed on one of the two of second composite plugs 503. The second set of metal spacers may be disposed on first composite plug 501. The third set of metal spacers may be disposed on another one of the two second composite plugs 503. The fourth set of metal spacers may be disposed on a top surface of the second insulating film 903. In other words, the first set of metal spacers, the second set of metal spacers, and the third set of metal spacers may be electrically connected to the plurality of composite plugs. The fourth set of metal spacers may be dummy; that is to say, the fourth set of metal spacers may not electrically connect or couple to any conductive element.

With reference to FIG. 1, in the embodiment depicted, the first set of metal spacers includes a first metal spacer 601 and a second metal spacer 603. The first metal spacer 601 and the second metal spacer 603 may be disposed on the one of the two of second composite plugs 503 and in the third insulating film 905. The first metal spacer 601 may have two sidewalls. One of the two sidewalls of the first metal spacer 601 may be attached to the third insulating film 905. The second metal spacer 603 may be attached to another one of the two sidewalls of the first metal spacer 601. A combined bottom width of the first metal spacer 601 and the second metal spacer 603 may be equal to or greater than a top width the one of the two of second composite plugs 503.

With reference to FIG. 1, in the embodiment depicted, the second set of metal spacers includes a third metal spacer 605 and a fourth metal spacer 607. The third metal spacer 605 and the fourth metal spacer 607 may be disposed on the first composite plug 501 and in the third insulating film 905. The fourth metal spacer 607 may have two sidewalls. One of the two sidewalls of the fourth metal spacer 607 may be attached to the third insulating film 905. The third metal spacer 605 may be attached to another one of the two sidewalls of the fourth metal spacer 607. The second metal spacer 603 and the third metal spacer 605 may be opposite to each other. A combined bottom width of the third metal spacer 605 and the fourth metal spacer 607 may be equal to or greater than a top width of the first composite plug 501. In addition, the third metal spacer 605 and the second metal spacer 603 may have mirror symmetry in a cross-sectional view. The fourth metal spacer 607 and the first metal spacer 601 may have mirror symmetry in a cross-sectional view.

With reference to FIG. 1, in the embodiment depicted, the third set of metal spacers includes a fifth metal spacer 609 and a sixth metal spacer 611. The fifth metal spacer 609 and the sixth metal spacer 611 may be disposed on the other one of the two of second composite plugs 503 and in the third insulating film 905. The fifth metal spacer 609 may have two sidewalls. One of the two sidewalls of the fifth metal spacer 609 may be attached to the third insulating film 905. The sixth metal spacer 611 may be attached to another one of the two sidewalls of the fifth metal spacer 609. A combined bottom width of the fifth metal spacer 609 and the sixth metal spacer 611 may be equal to or greater than a top width of the other one of the two of second composite plugs 503. The fifth metal spacer 609 may be opposite to the fourth metal spacer 607 with the third insulating film 905 interposed therebetween. In addition, the fifth metal spacer 609 may have a same profile/shape as the first metal spacer 601 in a cross-sectional diagram. The sixth metal spacer 611 may have a same profile/shape as the second metal spacer 603 in a cross-sectional diagram.

With reference to FIG. 1, in the embodiment depicted, the fourth set of metal spacers includes a seventh metal spacer 613 and an eighth metal spacer 615. The seventh metal spacer 613 and the eighth metal spacer 615 may be disposed on the top surface of the second insulating film 903 and in the third insulating film 905. In other words, the seventh metal spacer 613 and the eighth metal spacer 615 may be dummy; that is to say, the seventh metal spacer 613 and the eighth metal spacer 615 may not electrically connect or couple to any conductive element. The seventh metal spacer 613 may be opposite to the sixth metal spacer 611. In addition, the seventh metal spacer 613 may have a same profile/shape as the third metal spacer 605 in a cross-sectional diagram. The eighth metal spacer 615 may have a same profile/shape as the fourth metal spacer 607 in a cross-sectional diagram. Furthermore, the seventh metal spacer 613 and the sixth metal spacer 611 may have mirror symmetry in a cross-sectional view. The eighth metal spacer 615 and the fifth metal spacer 609 may have mirror symmetry in a cross-sectional view.

With reference to FIG. 1, in the embodiment depicted, the plurality of air gaps 600 may be disposed above the substrate 101 and in the third insulating film 905. The plurality of air gaps 600 may be respectively corresponding disposed between the first set of metal spacers and the second set of metal spacers, and between the third set of metal spacers and the fourth set of metal spacers. Specifically, the plurality of air gaps 600 may be respectively correspondingly disposed between the second metal spacer 603 and the third metal spacer 605, and between the sixth metal spacer 611 and the seventh metal spacer 613. One of the plurality of air gaps 600 may respectively be spaces surrounded by the sealing film 907, the second metal spacer 603, the third metal spacer 605, and the second insulating film 903. The other one of the plurality of air gaps 600 may be respectively surrounded by the sealing film 907, the sixth metal spacer 611, the seventh metal spacer 613, and the second insulating film 903.

Figure 2:
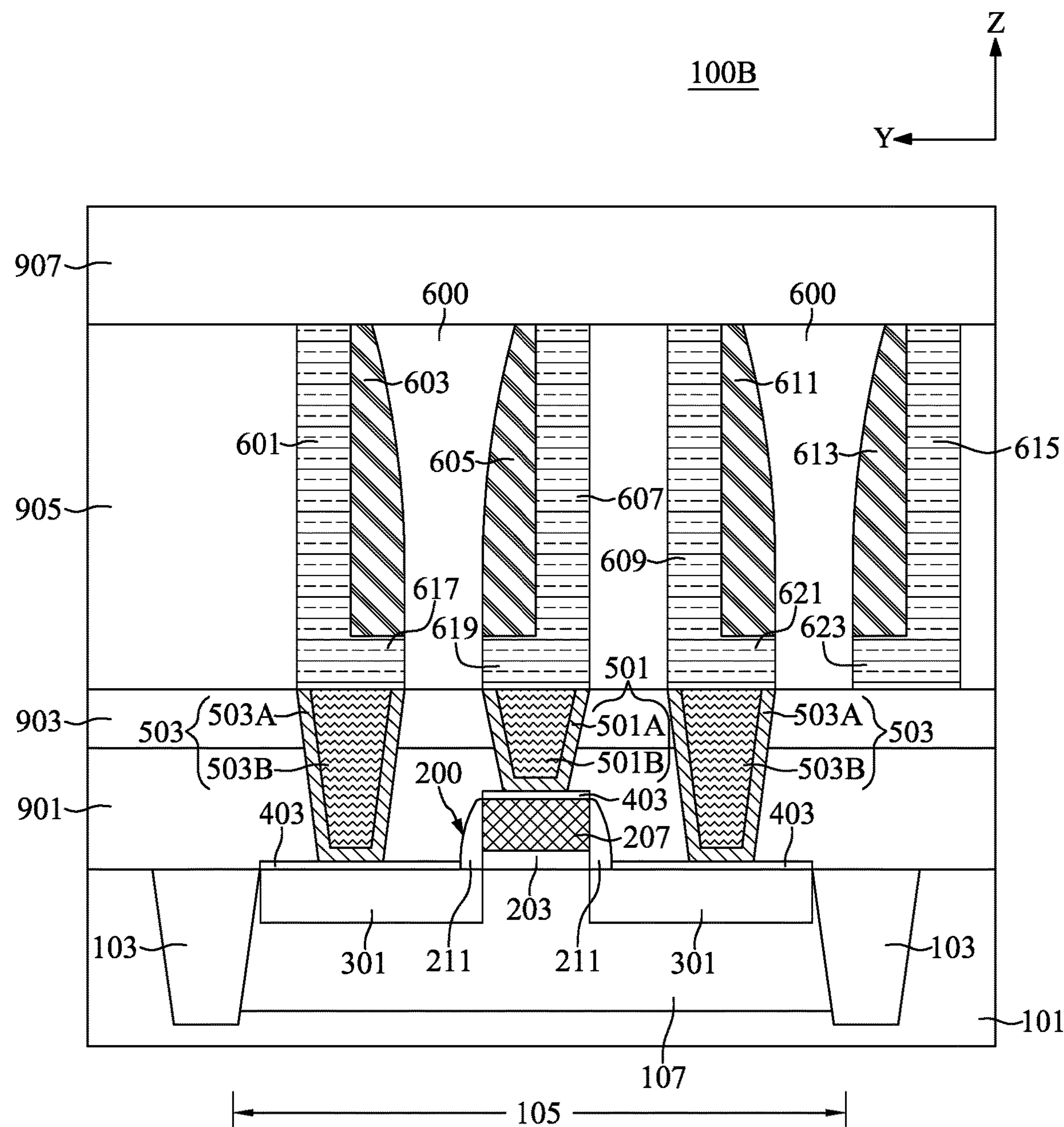
FIG. 2 illustrates, in a schematic cross-sectional view diagram, a semiconductor device in accordance with another embodiment of the present disclosure.

FIG. 2 illustrates, in a schematic cross-sectional view diagram, a semiconductor device 100B in accordance with another embodiment of the present disclosure.

With reference to FIG. 2, the first metal spacer 601 may further include a first protruding portion 617. The first protruding portion 617 may be extended form a lower portion of the first metal spacer 601, along a first direction Y, and toward the fourth metal spacer 607. In other words, the first metal spacer 601 may have an L-shaped profile in a cross-sectional view. The first protruding portion 617 may be disposed on the one of the two second composite plugs 503. A width of the first protruding portion 617 may be equal to or greater than the width of the top surface of the one of the two second composite plugs 503. The second metal spacer 603 may be disposed on the first protruding portion 617.

With reference to FIG. 2, the fourth metal spacer 607 may further include a second protruding portion 619. The second protruding portion 619 may be extended form a lower portion of the fourth metal spacer 607, along the first direction Y, and toward the first metal spacer 601. In other words, the fourth metal spacer 607 and the first metal space 601 may have a mirrored L-shaped profile in a cross-sectional view. The second protruding portion 619 may be disposed on the first composite plug 501. A width of the second protruding portion 619 may be equal to or greater than the width of the top surface of the first composite plugs 501. The third metal spacer 605 may be disposed on the second protruding portion 619.

With reference to FIG. 2, the fifth metal spacer 609 may further include a third protruding portion 621. The third protruding portion 621 may be extended form a lower portion of the fifth metal spacer 609, along the first direction Y, and toward the eighth metal spacer 615. In other words, the fifth metal spacer 609 may have an L-shaped profile in a cross-sectional view. The third protruding portion 621 may be disposed on the other one of the two second composite plugs 503. A width of the third protruding portion 621 may be equal to or greater than the width of the top surface of the other one of the two second composite plugs 503. The sixth metal spacer 611 may be disposed on the third protruding portion 621.

With reference to FIG. 2, the eighth metal spacer 615 may further include a fourth protruding portion 623. The fourth protruding portion 623 may be extended form a lower portion of the eighth metal spacer 615, along the first direction Y, and toward the fifth metal spacer 609. In other words, the eighth metal spacer 615 and the fifth metal spacer 609 may have a mirrored L-shaped profile in a cross-sectional view. The fourth protruding portion 623 may be disposed on the second insulating film 903. The seventh metal spacer 613 may be disposed on the fourth protruding portion 623.

With reference to FIG. 2, one of the plurality of air gaps 600 may be respectively spaces surrounded by the sealing film 907, the second metal spacer 603, the third metal spacer 605, the first protruding portion 617, the second protruding portion 619, and the second insulating film 903. The other one of the plurality of air gaps 600 may be respectively surrounded by the sealing film 907, the sixth metal spacer 611, the seventh metal spacer 613, the third protruding portion 621, the fourth protruding portion 623, and the second insulating film 903.

Figure 3:
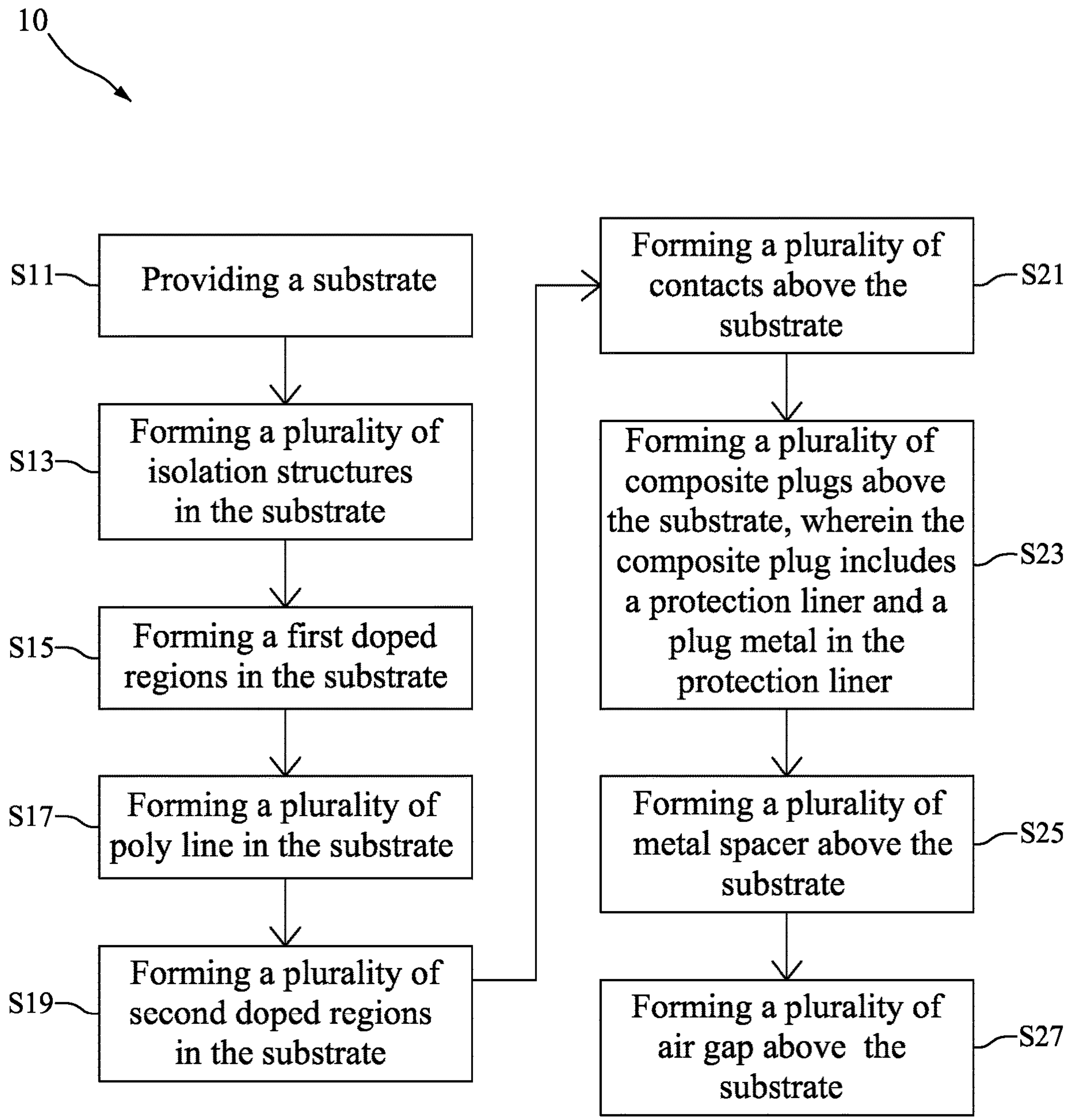
FIG. 3 illustrates, in a flowchart diagram form, a method for fabricating a semiconductor device in accordance with one embodiment of the present disclosure.
Figure 4:
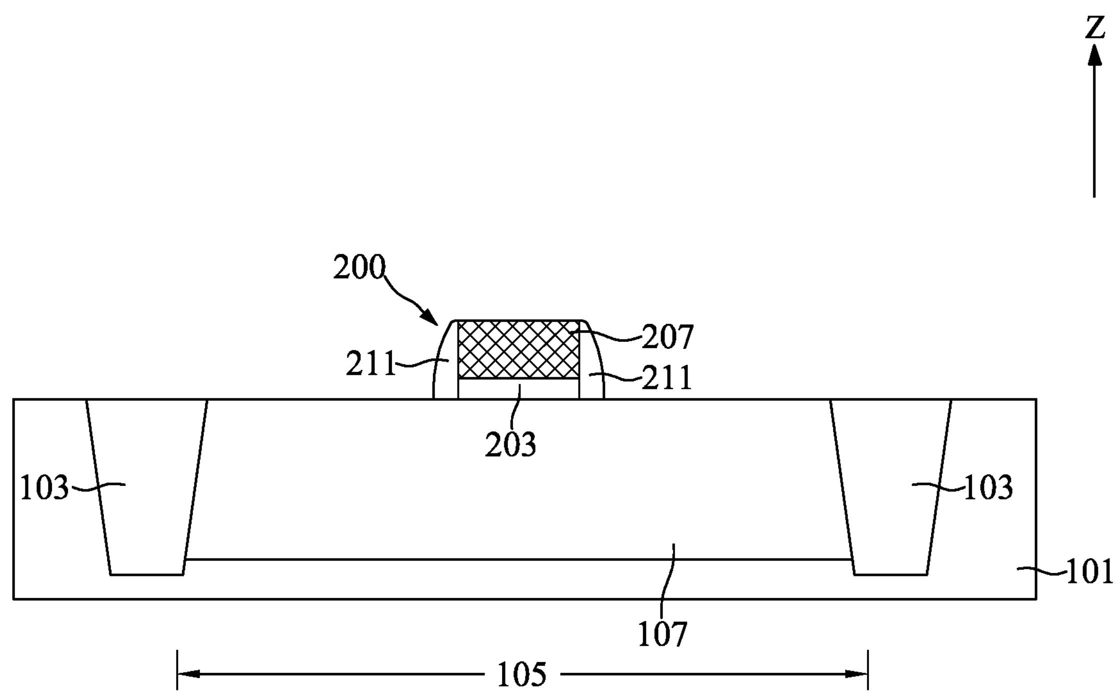
FIG. 4 illustrate, in schematic cross-sectional diagrams, part of a flow of fabricating a semiconductor device in accordance with one embodiment of the present disclosure.
Figure 5:
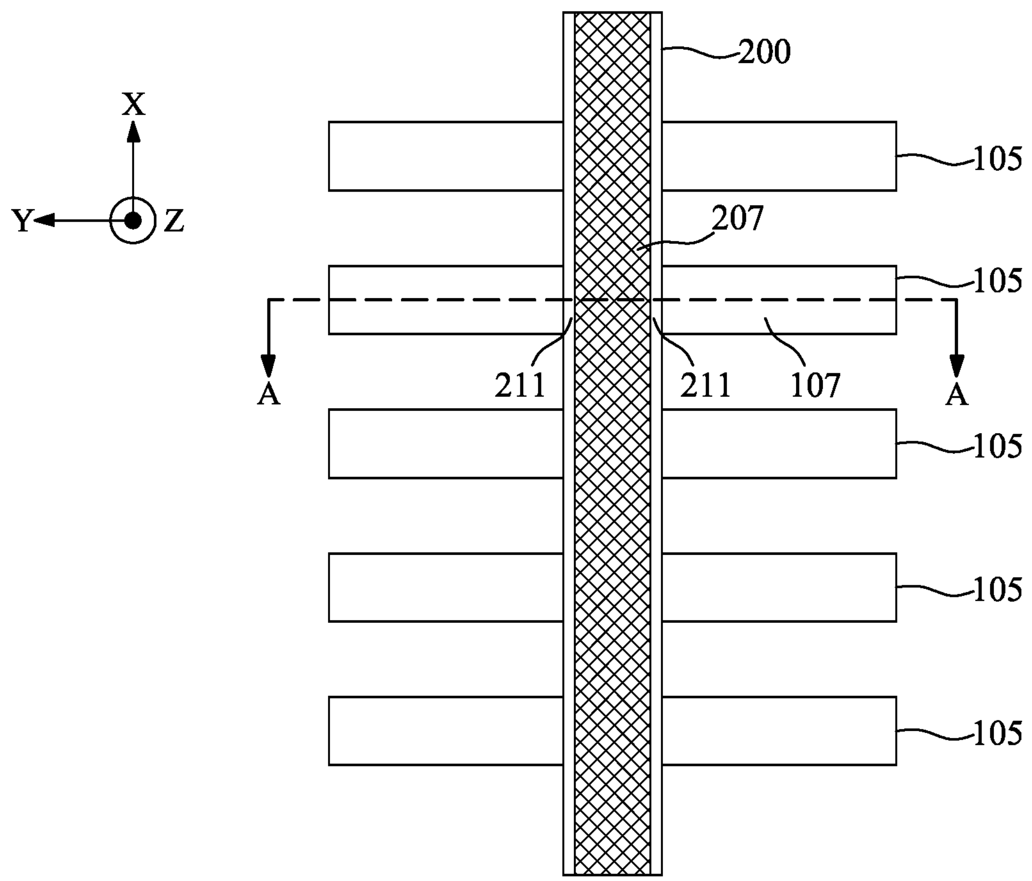
FIG. 5 illustrates, in a schematic top-view diagram, the semiconductor device in accordance with FIG. 4.

FIG. 3 illustrates, in a flowchart diagram form, a method 10 for fabricating a semiconductor device in accordance with one embodiment of the present disclosure. FIGS. 4 and 5 illustrate part of the flow of fabricating a semiconductor device in accordance with one embodiment of the present disclosure. FIG. 5 illustrates, in a schematic top-view diagram, the semiconductor device in accordance with FIG. 4.

With reference to FIG. 3 at step S11, the substrate 101 may be provided. With reference to FIG. 3, at step S13, the plurality of isolation structures 103 may be formed in the substrate 101. The plurality of isolation structures 103 may define the active area 105 of the substrate 101. A photolithography process may be used to pattern the substrate 101 to define positions of the plurality of isolation structures 103, then an etch process, such as an anisotropic dry etch process, may be performed to form the plurality of isolation structures openings in the substrate 101. After the etch process, an oxidation process may be performed such as thermal oxidation, chemical vapor deposition to form the plurality of isolation structures 103.

With reference to FIG. 3, at step S15, the first doped region 107 may be formed in the substrate 101. The first doped region 107 may be doped with a dopant such as phosphorus, arsenic, antimony, boron, aluminum or gallium by an implantation process.

With reference to FIG. 3, and FIGS. 4 and 5, at step S17, the word line 200 may be formed above the substrate 101. With reference to FIG. 4, an oxidation process may be performed such as thermal oxidation, chemical vapor deposition to form a gate oxide layer. A first photolithography process may be used to pattern the gate oxide layer to define positions of a gate oxide 203, then an etch process, such as an anisotropic dry etch process, may be performed to form the gate oxide 203 on the substrate 101. After gate oxide 203 may be formed, a poly gate layer may be formed by used such as chemical vapor deposition, physical vapor deposition, or sputtering. A second photolithography process may be used to pattern the poly gate layer to define positions of a poly gate 207, then an etch process, such as an anisotropic dry etch process, may be performed to form the poly gate 207 on the gate oxide 203. Then, the spacer layer may be formed by used such as thermal oxidation, chemical vapor deposition or the like. With reference to FIG. 4, then an etch process, such as an anisotropic dry etch process, may be performed to form the plurality of spacers 211 which adjacent to the sidewalls of the poly oxide 203 and the poly gate 207.

Figure 11:
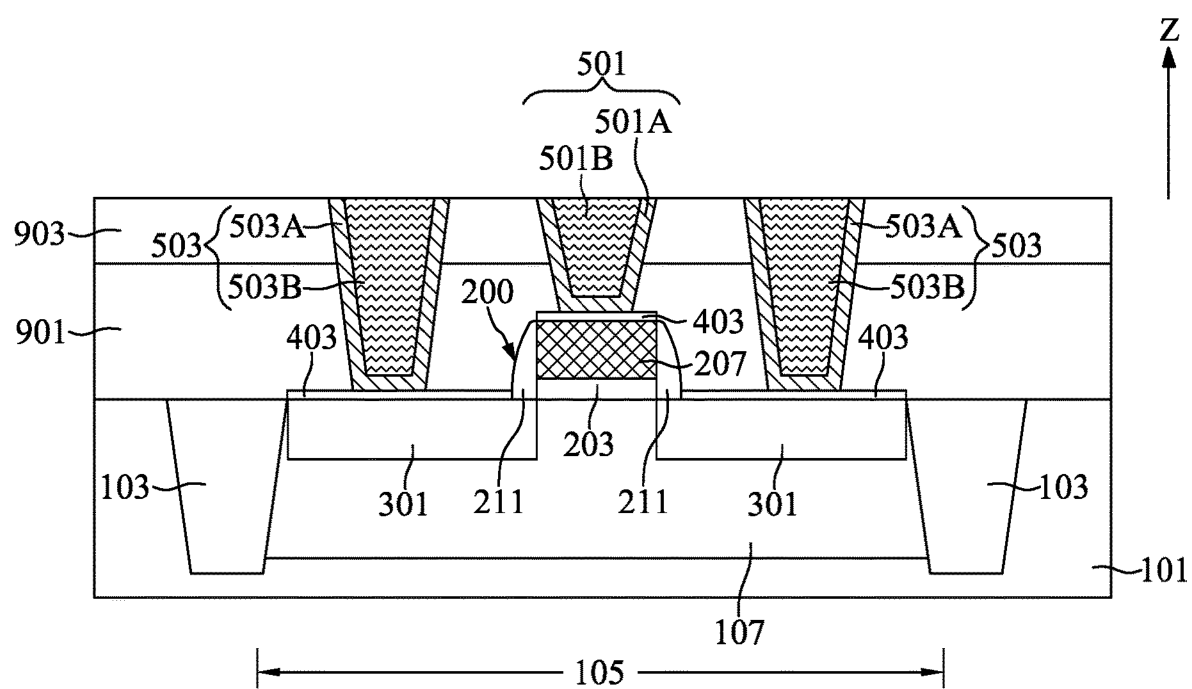
Figure 12:
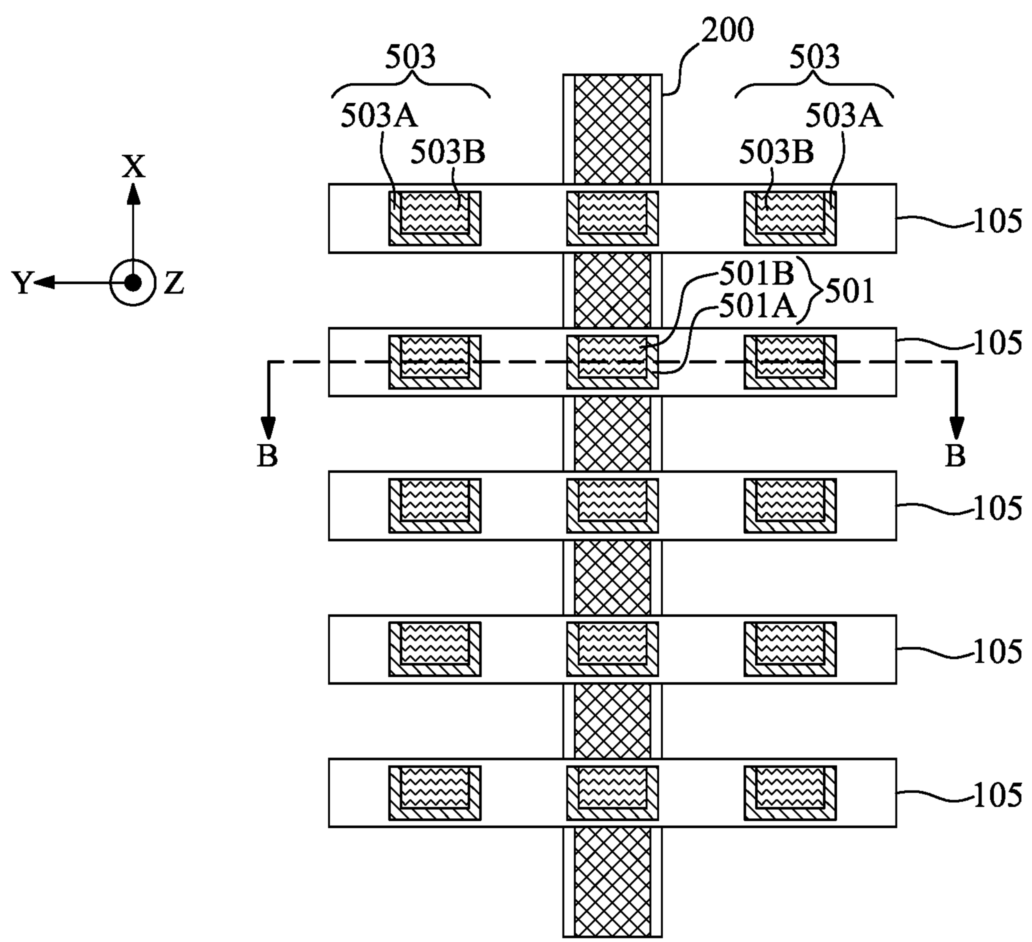
FIG. 12 illustrates, in a schematic top-view diagram, the semiconductor device in accordance with FIG. 11.
Figure 13:
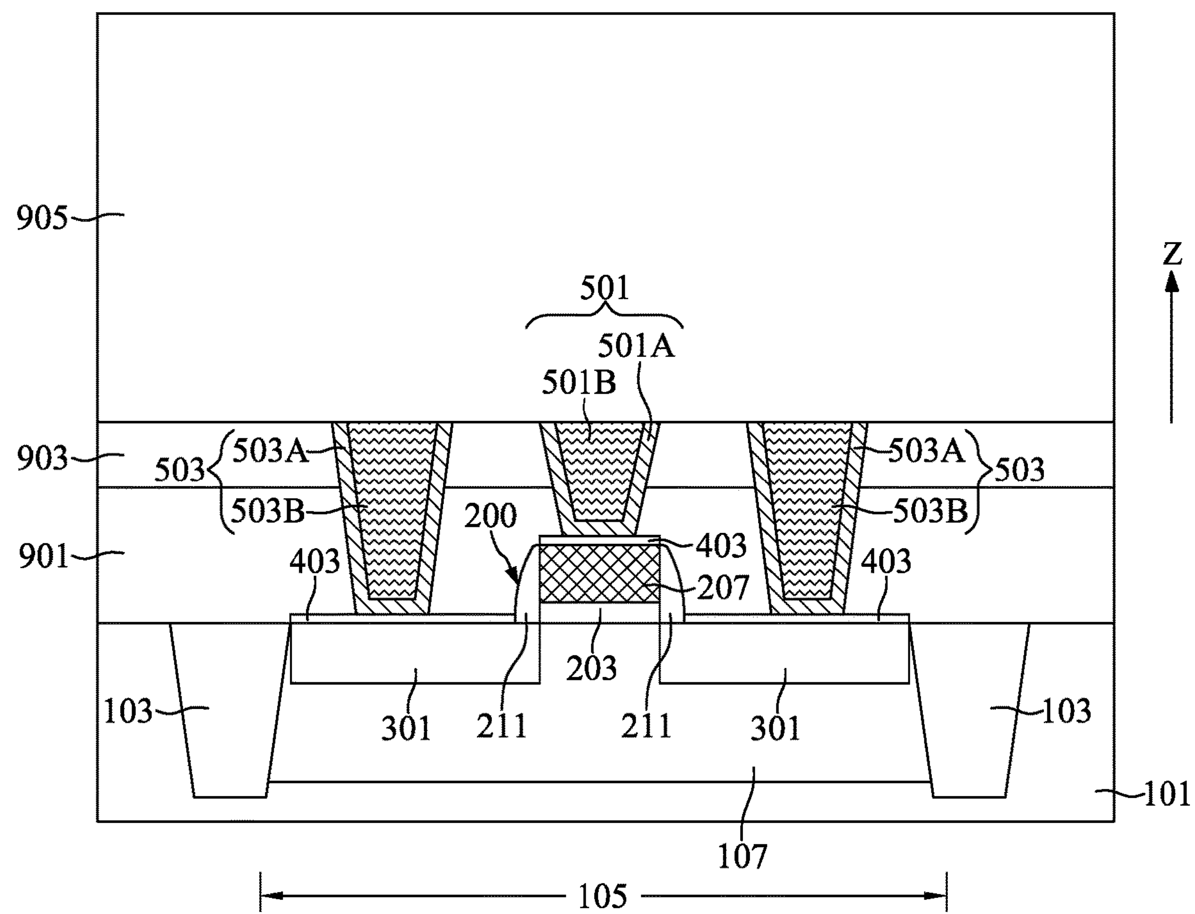
FIGS. 13 to 14 illustrate, in schematic cross-sectional diagrams, part of the flow of fabricating the semiconductor device in accordance with one embodiment of the present disclosure.
Figure 14:
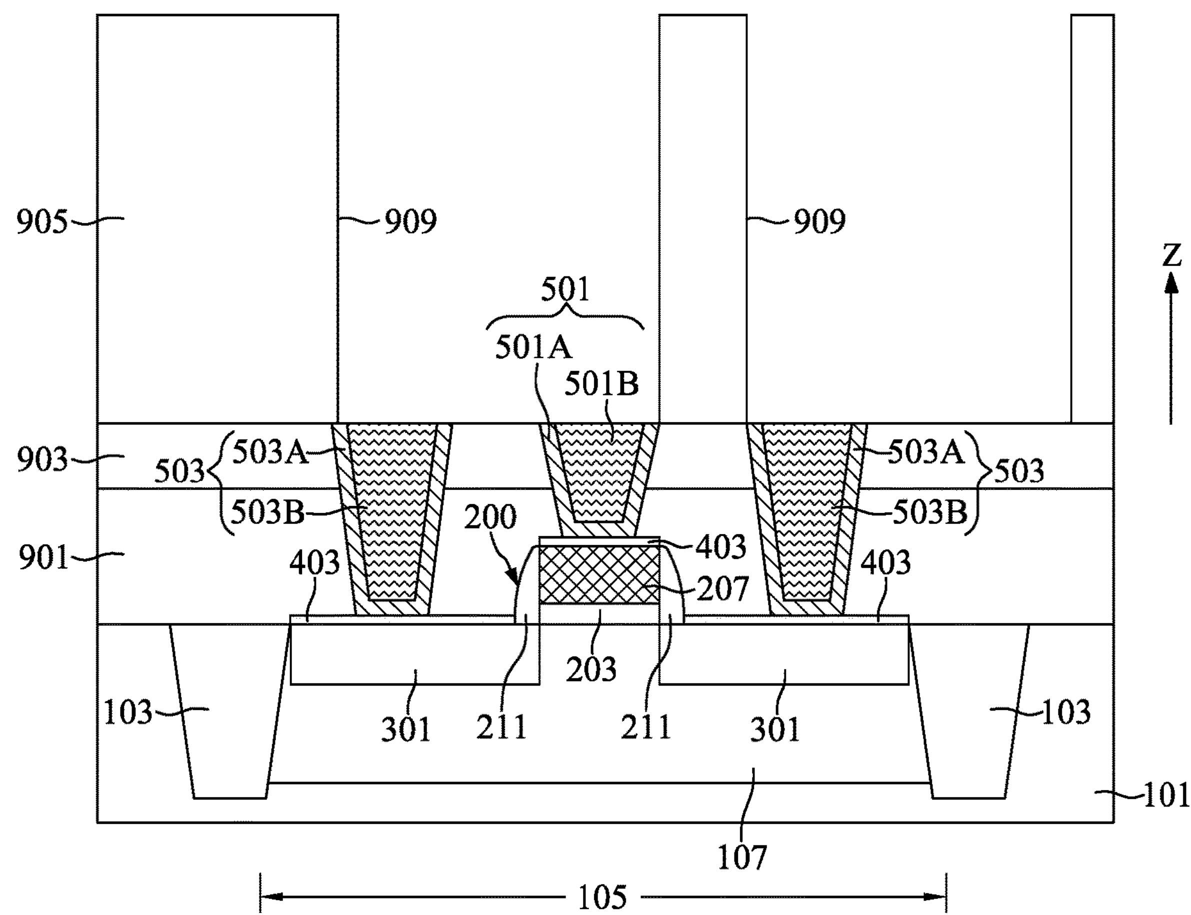
Figure 15:
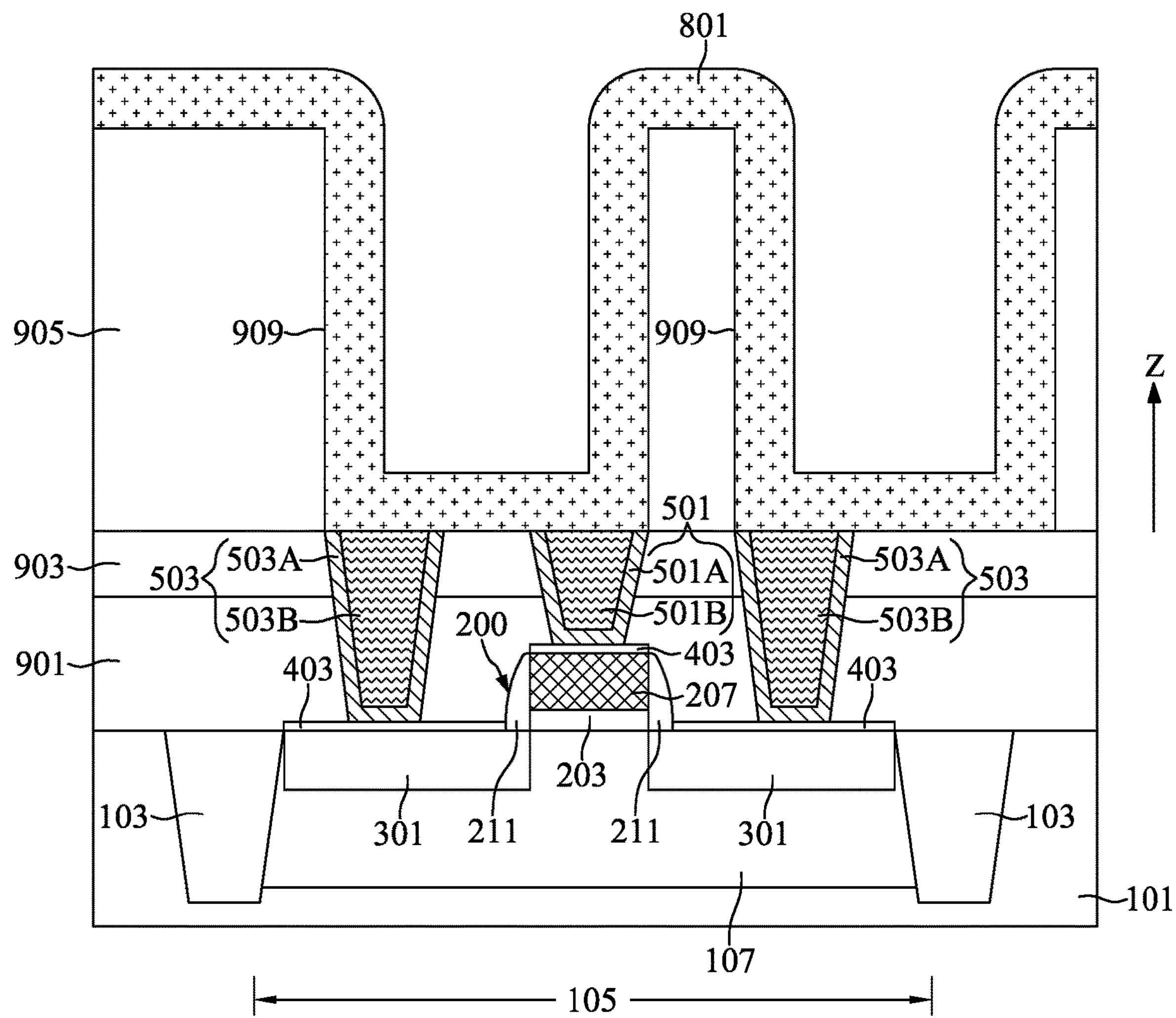
FIGS. 15 to 19 illustrate, in schematic cross-sectional diagrams, part of the flow of fabricating the semiconductor device in accordance with one embodiment of the present disclosure.

FIGS. 6 to 12 illustrate part of the flow of fabricating a semiconductor device in accordance with one embodiment of the present disclosure. FIG. 12 illustrates, in a schematic top-view diagram, the semiconductor device in accordance with FIG. 11 and FIGS. 13 to 19 illustrate part of the flow of fabricating a semiconductor device in accordance with one embodiment of the present disclosure.

Figure 6:
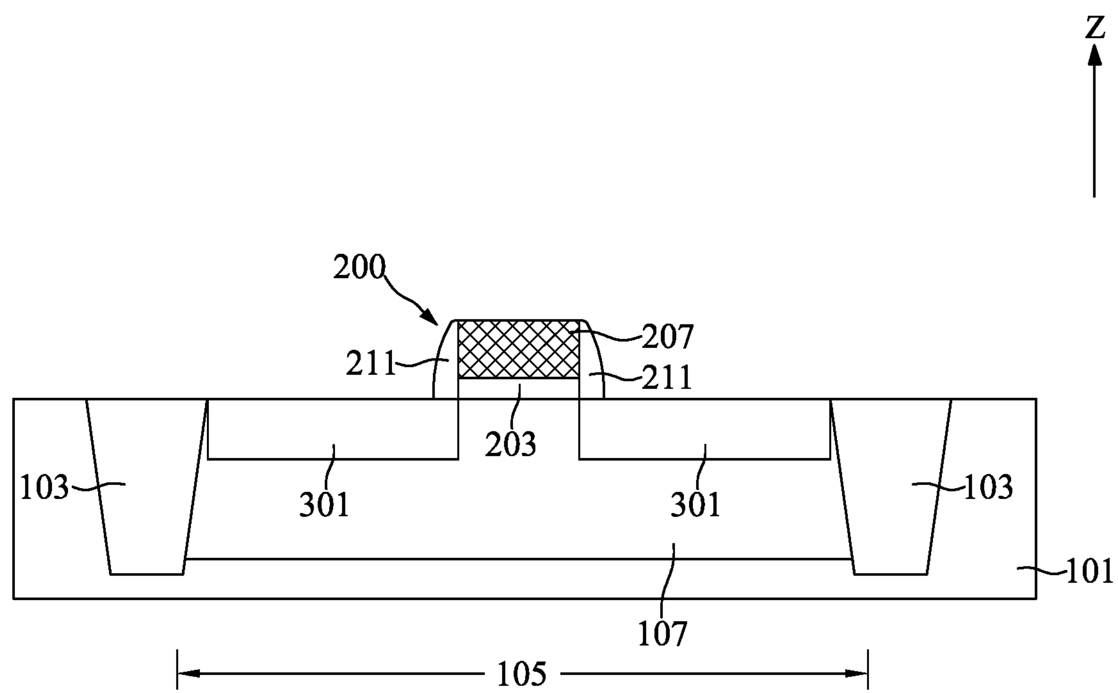
FIGS. 6 to 11 illustrate, in schematic cross-sectional diagrams, part of the flow of fabricating the semiconductor device in accordance with one embodiment of the present disclosure.
Figure 7:
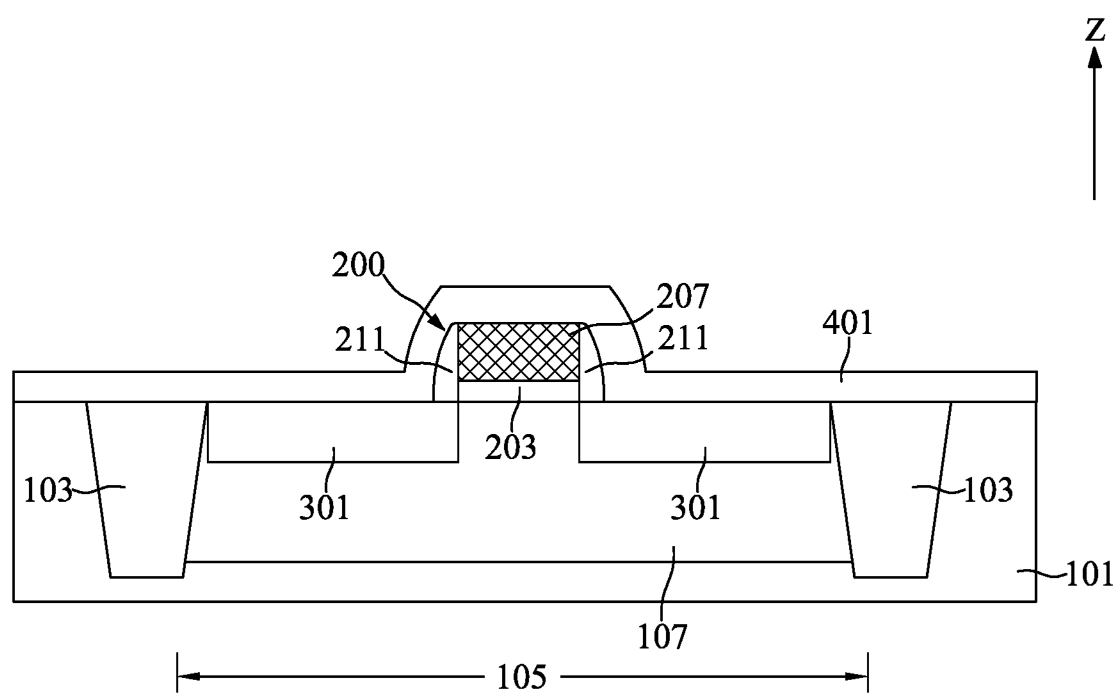
Figure 8:
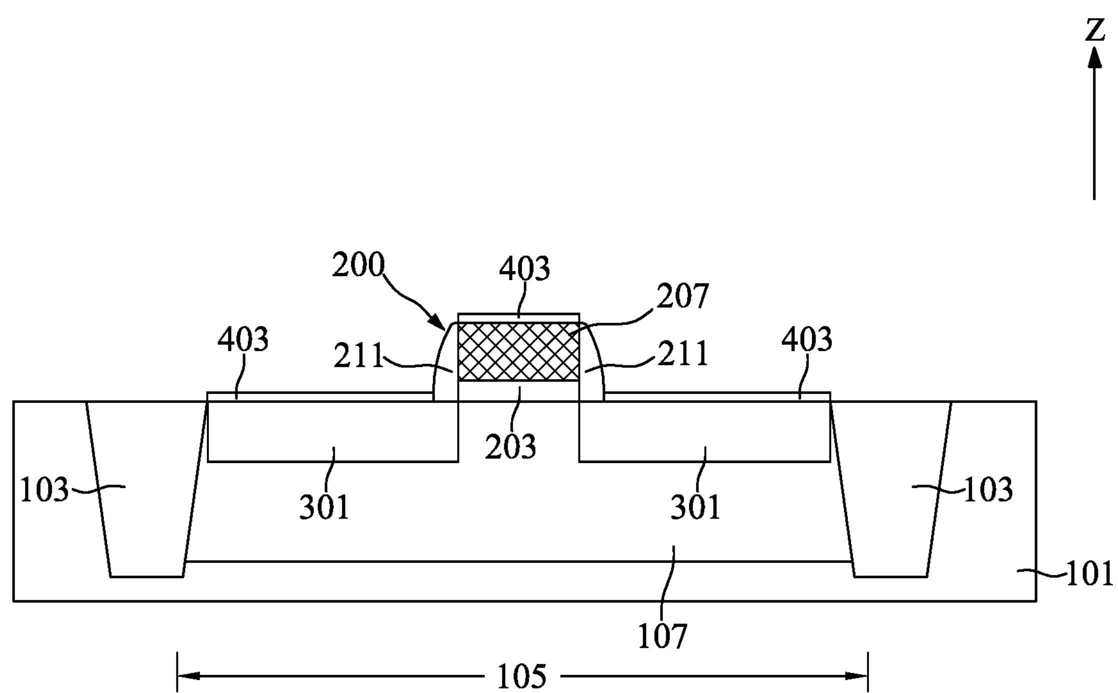
Figure 9:
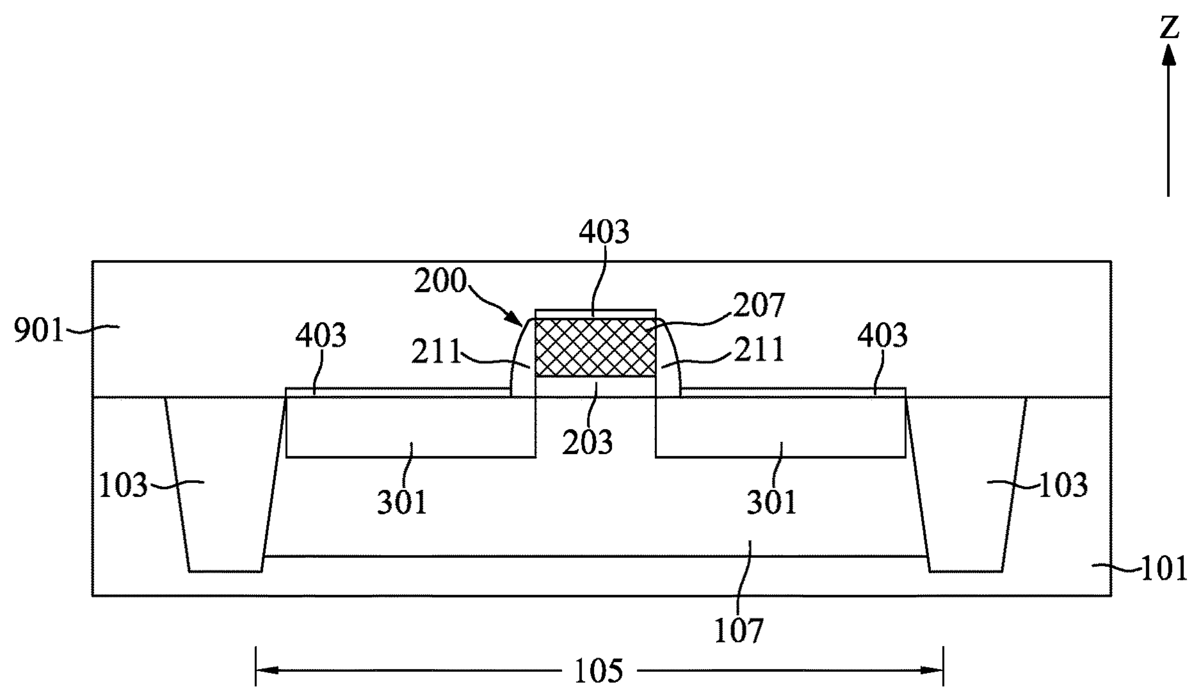
Figure 10:
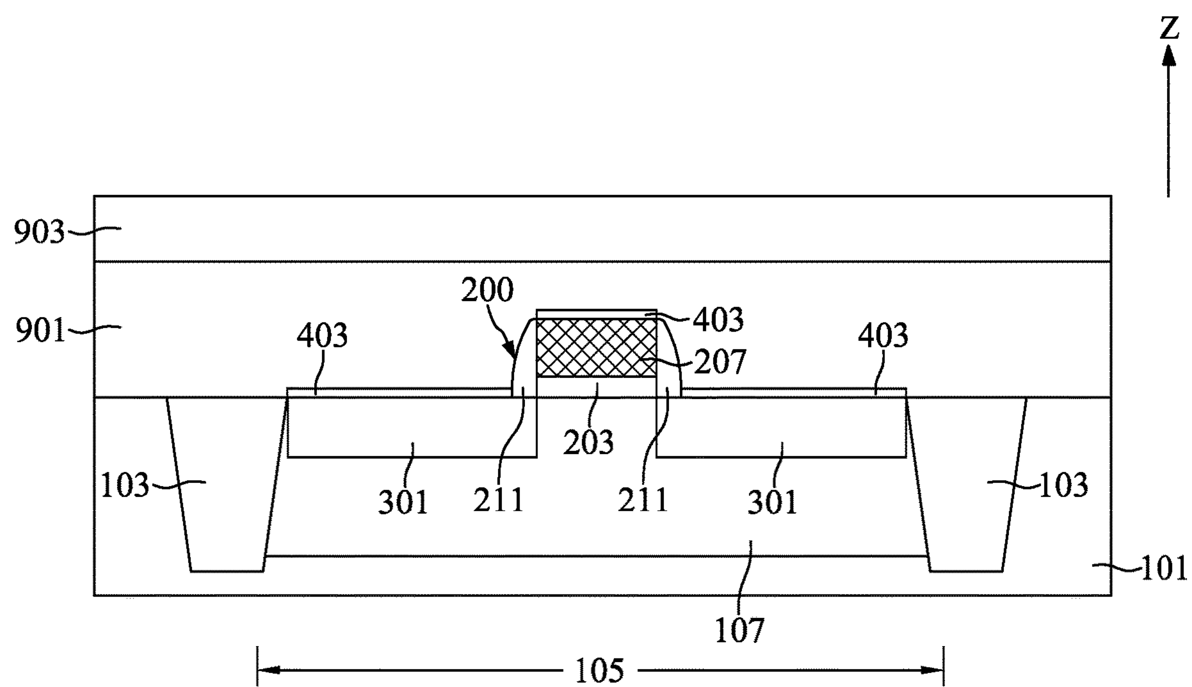

With reference to FIGS. 3 and 6, at step S19, the plurality of second doped regions 301 may be formed in the first doped region 107 and respectively formed between the plurality of isolation structures 103. The plurality of second doped regions 301 may be doped with a dopant such as phosphorus, arsenic, antimony, boron, aluminum or gallium by an implantation process With reference to FIGS. 3, 7, and 8, at step S21, the plurality of contacts 403 may be formed above the substrate 101. The plurality of contacts 403 may be formed respectively on tops of the poly gate 207 and the plurality of second doped regions 301. With reference to FIG. 7, a contact layer 401 may be formed of, for example, cobalt, titanium or other suitable metal or metal alloy, by deposition process such as chemical vapor deposition, physical vapor deposition, sputtering, or the like. With reference to FIG. 8, an etch process, such as an anisotropic dry etch process, may be performed to form the plurality of contacts 403.

With reference to FIGS. 3, 9 to 12, at step S23, the plurality of composite plugs may be formed above the substrate 101. The plurality of composite plugs may include a first composite plug 501 and two second composite plugs 503. With reference FIG. 9, a first insulating film 901 may be formed by deposition process such as chemical vapor deposition, physical vapor deposition, sputtering, or the like. With reference FIG. 10, the second insulating film 903 may be formed on the first insulating film 901 by deposition process same as formed the first insulating film 901.

With reference FIG. 11, a photolithography process may be used to pattern the second insulating film 903 to define positions of the plurality of composite plugs. An etch process, such as an anisotropic dry etch process, may be performed after the photolithography process to form the plurality of composite plugs opening passed through the second insulating film 903 and the first insulating film 901.

Next, a protection liner 501A is formed in the openings and a metal plug 501B is then formed on the protection liner 501A in the opening, implementing a composite plug 501. Similarly, a protection liner 503A is formed in the openings and a metal plug 501B is then formed on the protection liner 503A in the opening, implementing a composite plug 503.

In some embodiments, the protection liner 501A and the protection liner 503A have U-shaped profile and are in direct contact with an upper portion of the contacts 403. In some embodiments, the protection liners 501A, 501B are made of a material having a function of improving the adhesion between the contact 403 and the metal plugs 501B, 503B and also a function of suppressing the diffusion of component atoms of the metal plugs 501B, 503B. Examples of the material include tungsten (W), titanium nitride (TiN), titanium (Ti), tantalum (Ta), tungsten-nitride (WN), tungsten silicide nitride (WSiN), titanium silicide nitride (TiSiN), tantalum nitride (TaN) and tantalum silicide nitride (TaSiN). The protection liners 501A, 501B can be formed by CVD, PVD, atomic layer deposition (ALD), or any other appropriate method known in the art. In some embodiments, the metal plugs 501B, 503B may be a single layer including doped polysilicon, metal, metal silicide, or metal compound, or it may be a multi-layer including any combination of the above materials. In addition, the metal plugs 501B, 503B may be formed by a deposition process, such as a CVD process, a PVD process, an ALD process, a MOCVD process, a sputtering process, or another applicable process.

After the etch process, a conductive material, for example, aluminum, copper, tungsten, cobalt, or other suitable metal or metal alloy is filled, by a metallization process such as chemical vapor deposition, physical vapor deposition, sputtering, or the like, in the plurality of composite plugs opening. The plurality of composite plugs may be formed after a planarization process, such as chemical mechanical polishing, may be performed after the metallization process to remove excess filling material and provide a substantially flat surface for subsequent processing steps. The first composite plug 501 may be formed above the word line 200 and the two second composite plugs 503 may be respectively correspondingly formed above the plurality of second doped regions 301.

With reference to FIGS. 3, 13 to 18, at step S25, a plurality of metal spacers may be formed above the substrate 101. With reference FIG. 13, a third insulating film 905 may be formed on the second insulating film 903 by deposition process same as formed the first insulating film 901. With reference FIG. 14, a photolithography process may be used to pattern the third insulating film 905 to define positions of a plurality of trenches 909. An etch process, such as an anisotropic dry etch process, may be performed after the photolithography process to form the plurality of trenches 909 passed through the third insulating film 905. Top surfaces of the plurality of composite plugs may be exposed through the plurality of trenches 909. With reference FIG. 15, after the etch process, a conductive material, for example, aluminum, copper, tungsten, cobalt, or other suitable metal or metal alloy is deposited, by a deposition process such as chemical vapor deposition, physical vapor deposition, sputtering, or the like, in the plurality of trenches 909 to form a first metal spacer layer 801. The first metal spacer layer 801 cover a top surface and sidewalls of the third insulating film 905, and top surfaces of the plurality of composite plugs.

Figure 16:
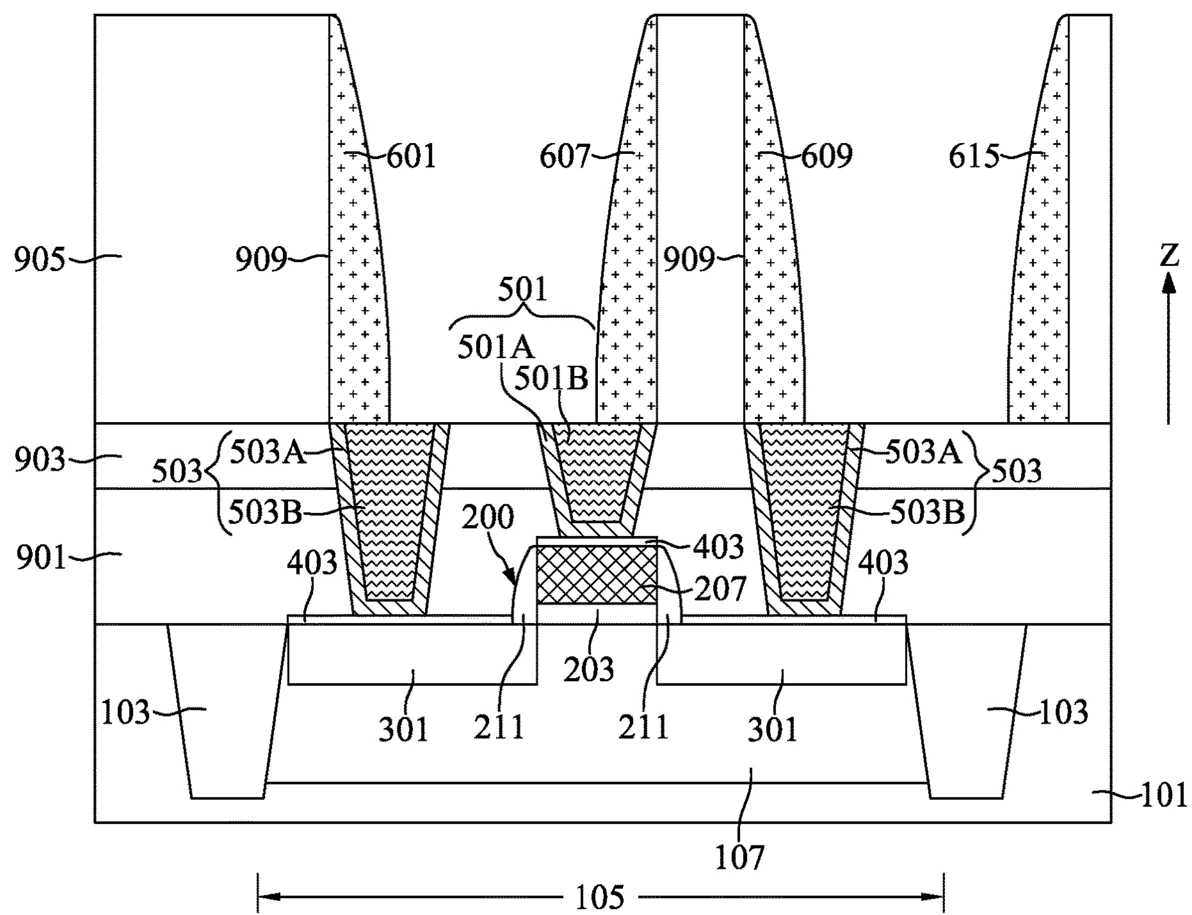

With reference FIG. 16, an etch process, such as an anisotropic dry etch process, may be performed to respectively correspondingly form a first metal spacer 601, a fourth metal spacer 607, a fifth metal spacer 609, and an eighth metal spacer 615 attached to sidewalls of the plurality of trenches 909. The first metal spacer 601 may be disposed on one of the two second composite plugs 503 and electrically connected thereto. A combined bottom width of the first metal spacer 601 may be equal to or less than a top width of the one of the two second composite plugs 503. The fourth metal spacer 607 may be disposed on the first composite plug 501 and electrically connected thereto. A combined bottom width of the fourth metal spacer 607 may be equal to or less than a top width of the first composite plug 501. The fifth metal spacer 609 may be disposed on another one of the two second composite plugs 503 and electrically connected thereto. A combined bottom width of the fifth metal spacer 609 may be equal to or less than a top width of the other one of the two second composite plugs 503. The eighth metal spacer 615 may be disposed on the second insulating film 903. A planarization process, such as chemical mechanical polishing, may be performed after the etch process to remove residue material and provide a substantially flat surface for subsequent processing steps.

Figure 17:
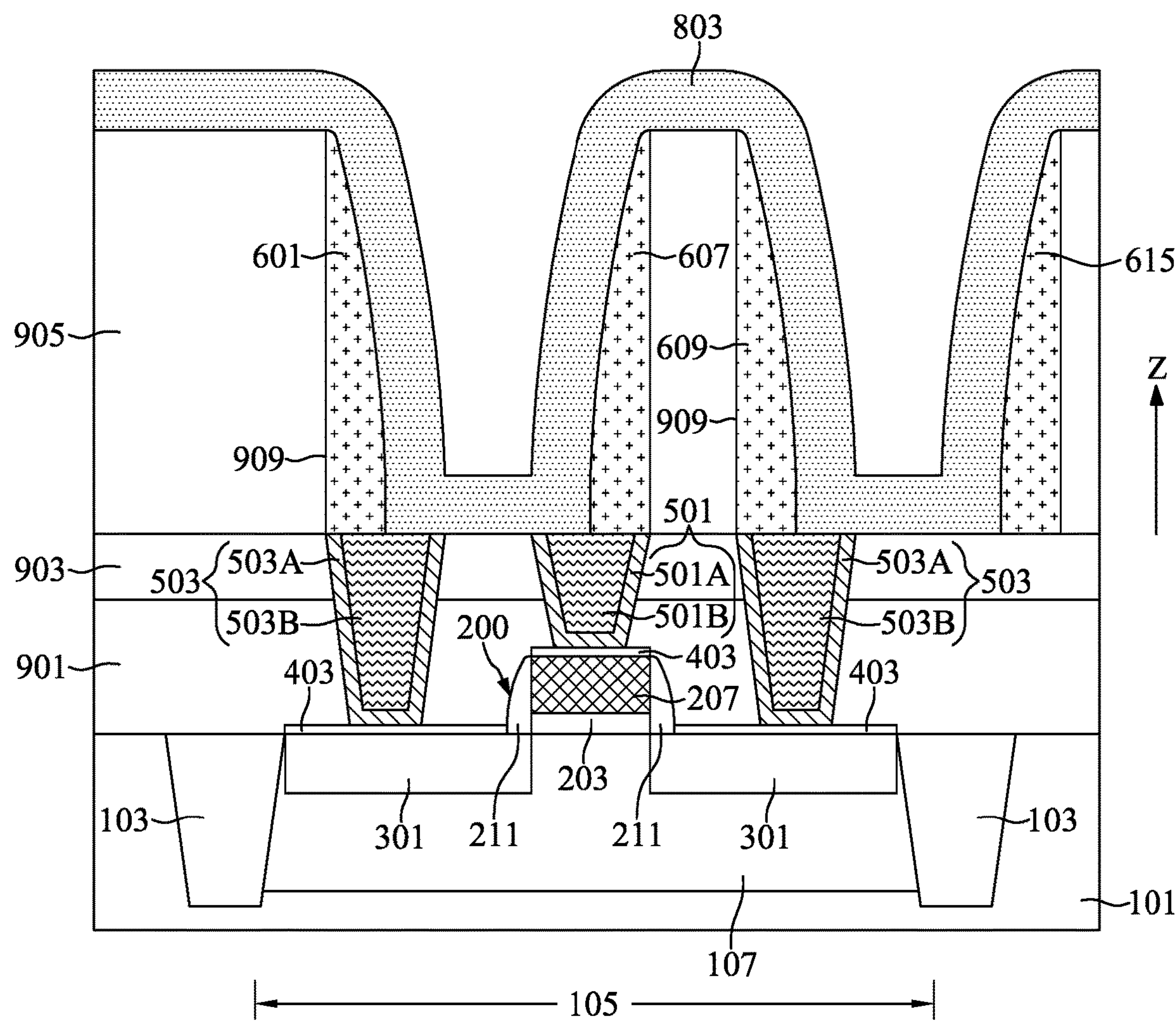

With reference to FIG. 17, a second metal spacer layer 803 may be formed over the third insulating film 905. The second metal spacer layer 803 may be formed of a same conductive material as the first metal spacer layer 801, but is not limited thereto. The second metal spacer layer 803 may be deposited, by a deposition process such as chemical vapor deposition, physical vapor deposition, sputtering, or the like. The second metal spacer layer 803 cover the top surface of the third insulating film 905, a sidewall of first metal spacer 601, a sidewall of the fourth metal spacer 607, a sidewall of the fifth metal spacer 609, a sidewall of the eighth metal spacer 615, and bottoms of the plurality of trenches 909. The top surfaces of the first composite plug 501 and the two second composite plugs 503 may be covered by the second metal spacer layer 803.

Figure 18:
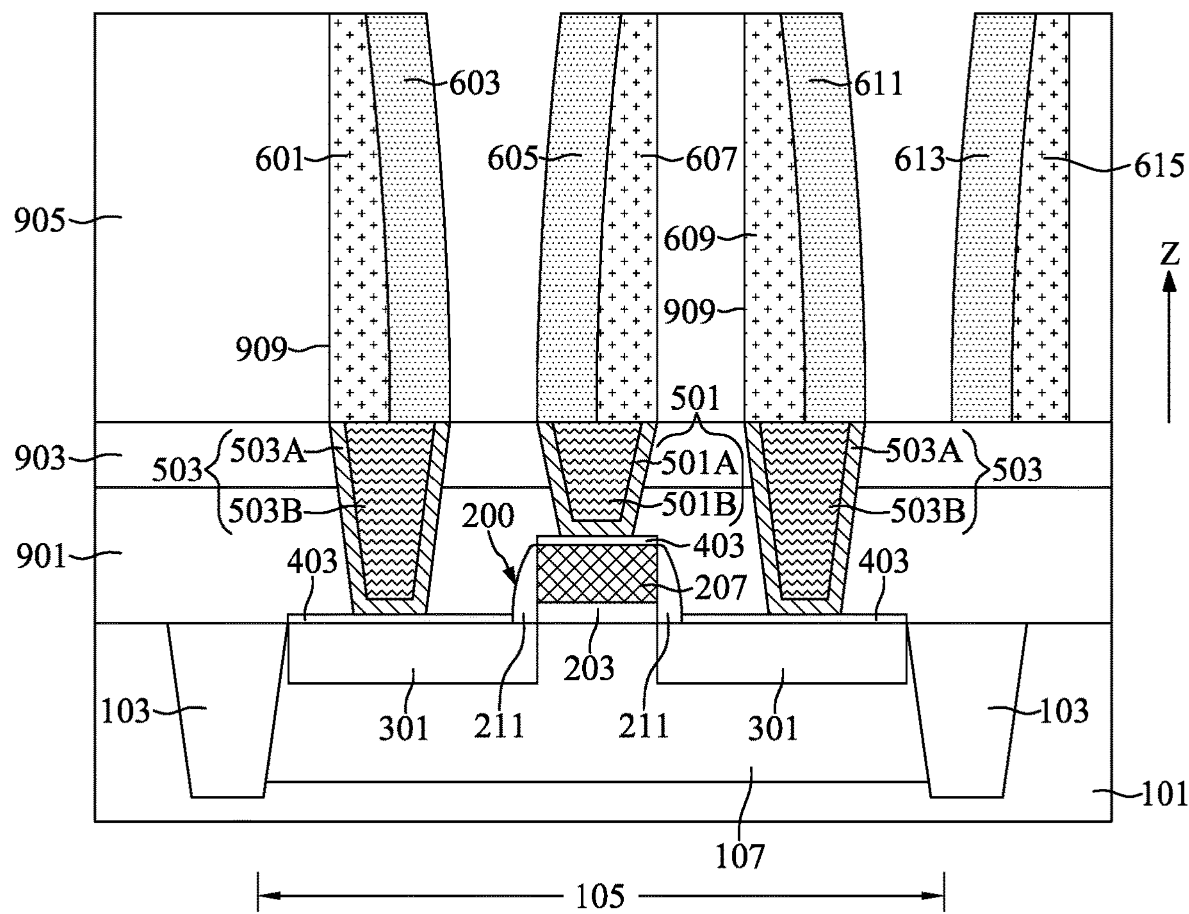
Figure 19:
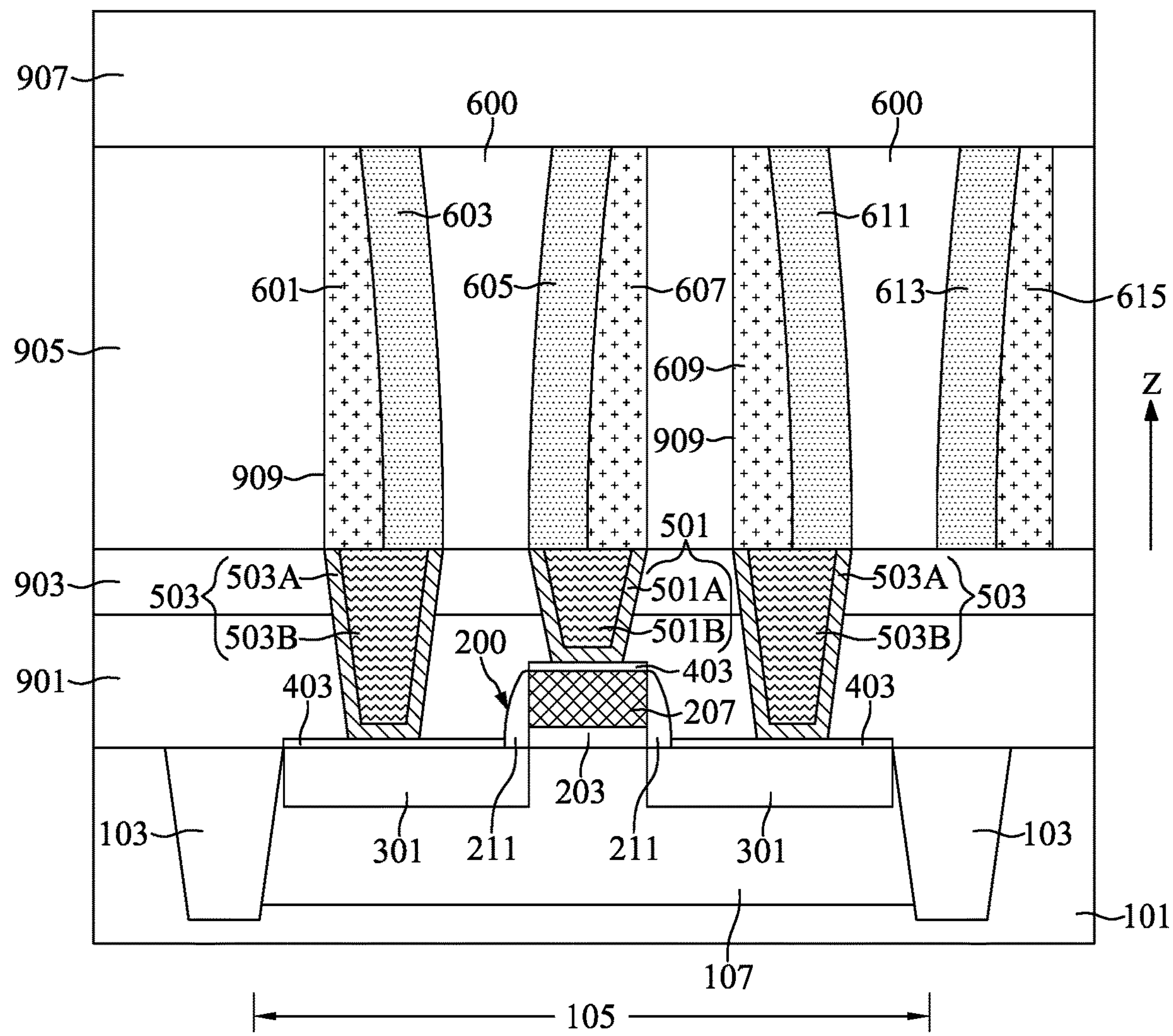

With reference to FIG. 18, an etch process, such as an anisotropic dry etch process, may be performed to respectively correspondingly form a second metal spacer 603, a third metal spacer 605, a sixth metal spacer 611, and a seventh metal spacer 613 respectively correspondingly attached to the sidewalls of the first metal spacer 601, the fourth metal spacer 607, the sixth metal spacer 611, and the seventh metal spacer 613. A planarization process, such as chemical mechanical polishing, may be performed after the etch process to provide a substantially flat surface for subsequent processing steps.

With reference back to FIGS. 1, 3 and 19, at step S27, a plurality of air gaps 600 may be formed above the substrate 101. The sealing film 907 may be formed on the third insulating film 905 by deposition process same as formed the first insulating film 901. Then the remained spaces of the plurality of trenches 909 may be concurrently turned in to the plurality of air gaps 600 after the formation of the sealing film 907. It should be noted that the term "seal" can mean either sealing the plurality of air gaps 600 without filling the plurality of air gaps 600 with any of the material formed of the sealing film 907, or sealing the plurality of air gaps 600 while partially filling the plurality of air gaps 600 with some of the material formed of the sealing film 907. A thickness of the sealing film 907 may be about 1000 Angstroms to about 5000 Angstroms. However, the thickness of the sealing film 907 may be set to an arbitrary range depending on the circumstances.

FIGS. 20 to 24 illustrate, in schematic cross-sectional diagrams, part of a flow of fabricating a semiconductor device in accordance with another embodiment of the present disclosure.

Figure 20:
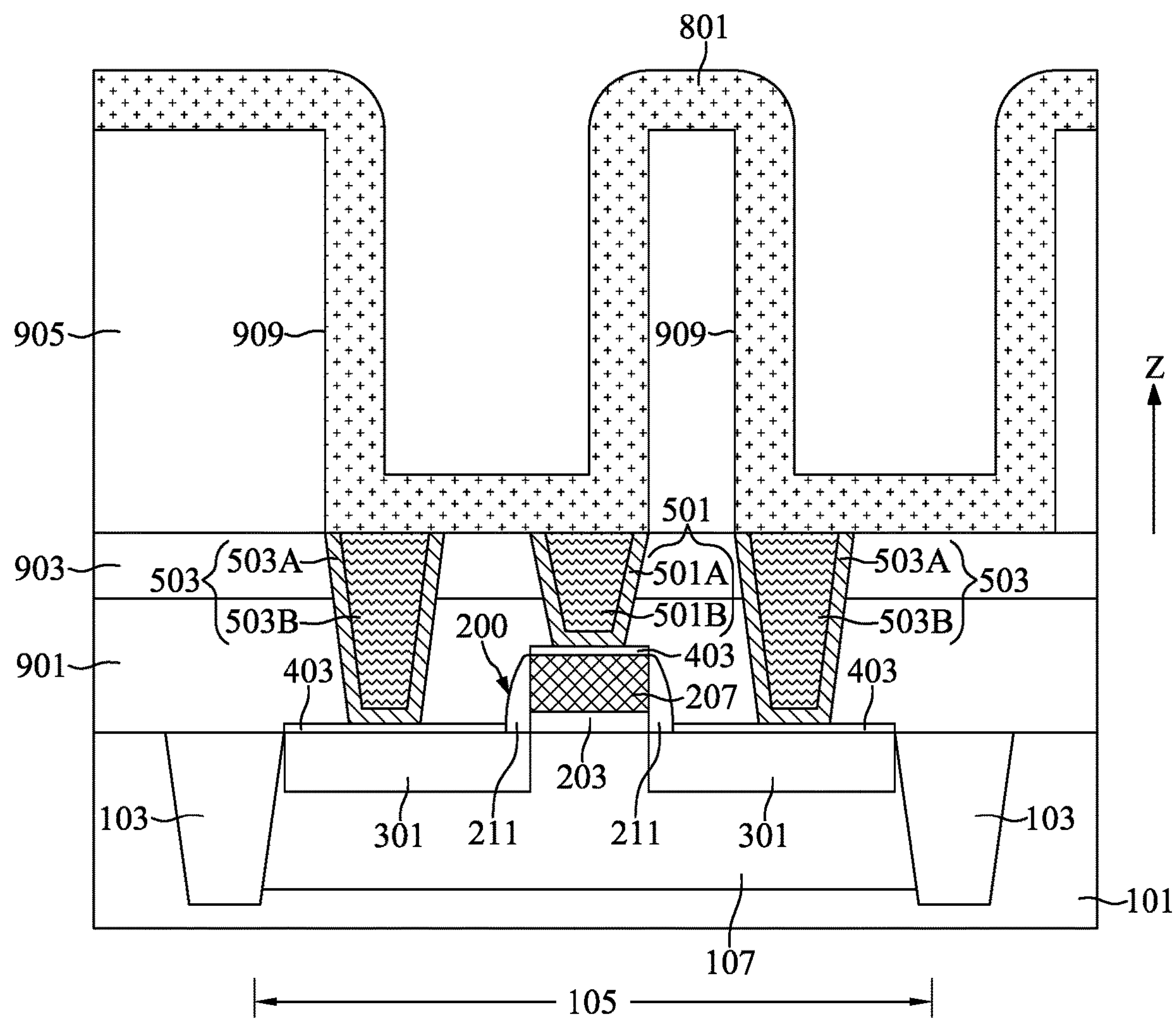
FIGS. 20 to 24 illustrate, in schematic cross-sectional diagrams, some semiconductor devices in accordance with another embodiment of the present disclosure.

With reference to FIG. 20, the first metal spacer layer 801 may be formed by a deposition process such as chemical vapor deposition, physical vapor deposition, sputtering, or the like over the third insulating film 905 and in the plurality of trenches 909. The first metal spacer layer 801 may cover the top surface of the third insulating film 905, the bottoms and the sidewalls of the plurality of trenches 909.

Figure 21:
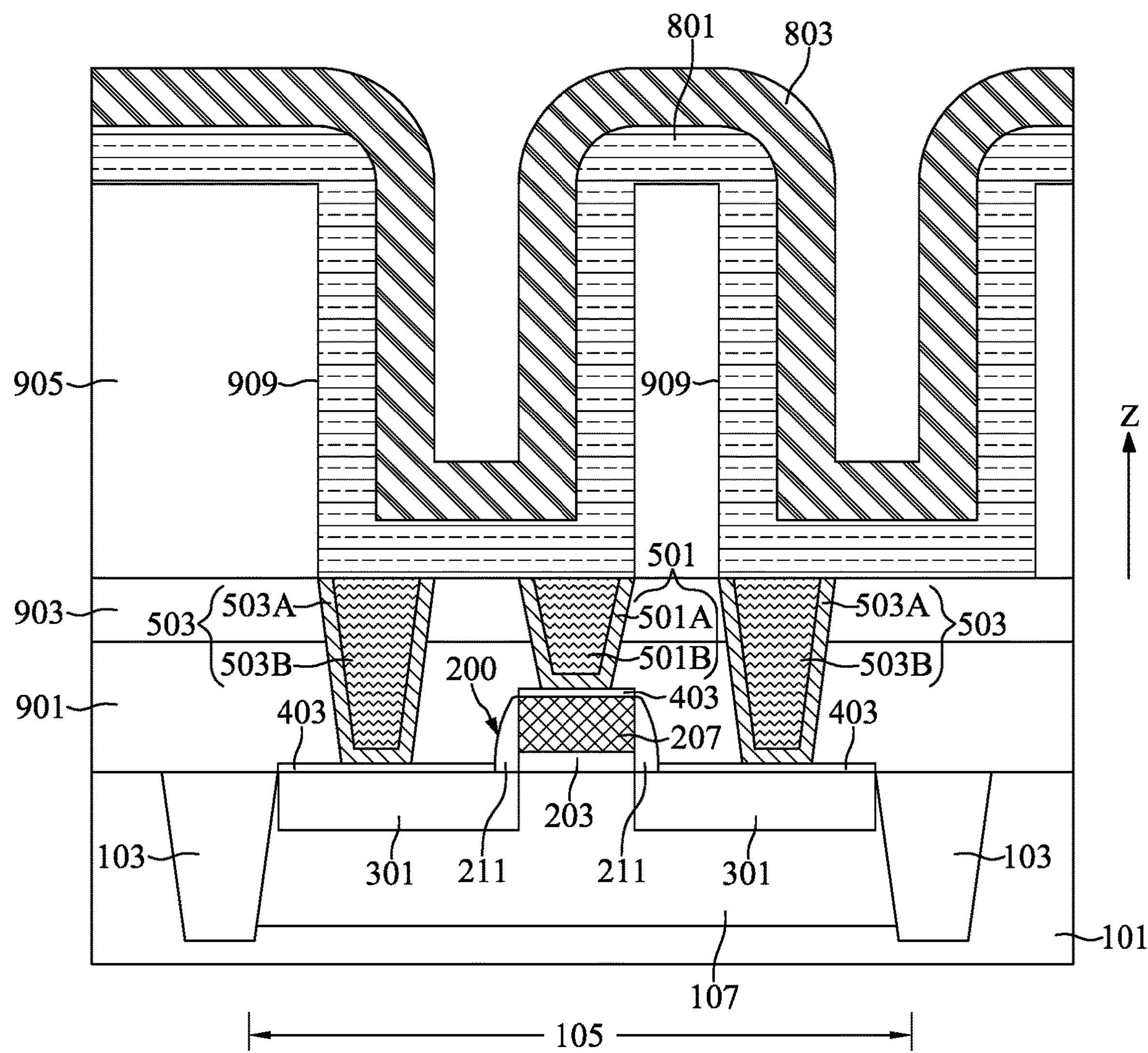
Figure 22:
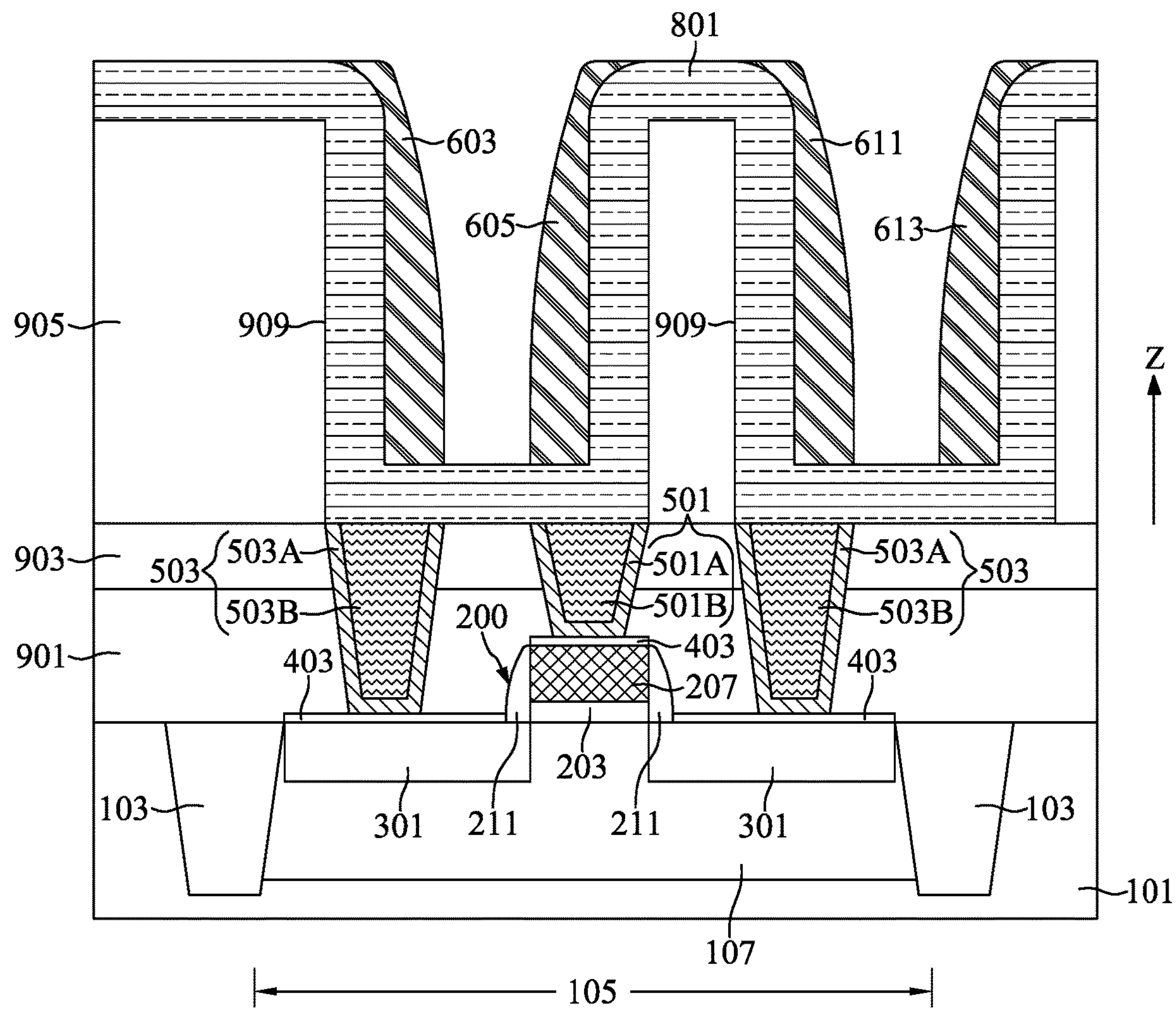

With reference to FIG. 21, the second metal spacer layer 803 may be formed by a deposition process such as chemical vapor deposition, physical vapor deposition, sputtering, or the like over the first metal spacer layer 801. The second metal spacer layer 803 may be a conductive material having etching selectivity to the first metal spacer layer 801. With reference to FIG. 22, an etch process, such as an anisotropic dry etch process, may be performed to remove portions of the second metal spacer layer 803 and concurrently form the second metal spacer 603, the third metal spacer 605, the sixth metal spacer 611, and the seventh metal spacer 613 disposed on the first metal spacer layer 801. A planarization process, such as chemical mechanical polishing, may be performed to provide a substantially flat surface for subsequent processing steps.

Figure 23:
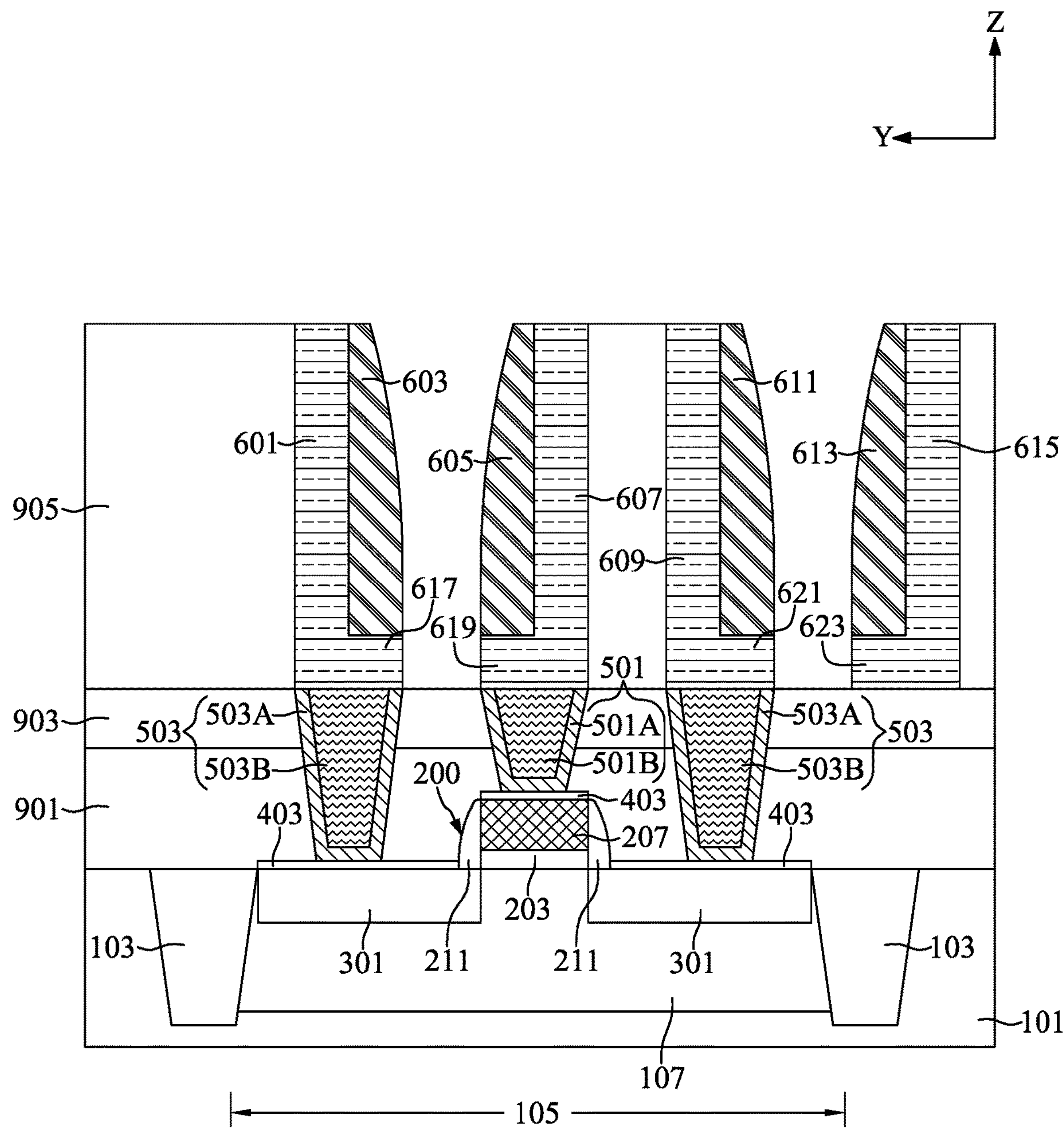

With reference FIG. 23, an etch process, such as an anisotropic dry etch process, may be performed to form the first metal spacer 601, the fourth metal spacer 607, the fifth metal spacer 609, and the eighth metal spacer 615. It should be noted that, during the etching process, the second metal spacer 603, the third metal spacer 605, the sixth metal spacer 611, and the seventh metal spacer 613 may be respectively correspondingly serve as masks for the first metal spacer 601, the fourth metal spacer 607, the fifth metal spacer 609, and the eighth metal spacer 615. As a result of that, a first protruding portion 617 of the first metal spacer 601, a second protruding portion 619 of the fourth metal spacer 607, a third protruding portion 621 of the fifth metal spacer 609, and a fourth protruding portion 623 of the eighth metal spacer 615 may respectively correspondingly formed below the second metal spacer 603, the third metal spacer 605, the sixth metal spacer 611, and the seventh metal spacer 613. A planarization process may be performed to provide a substantially flat surface for subsequent processing steps.

Figure 24:
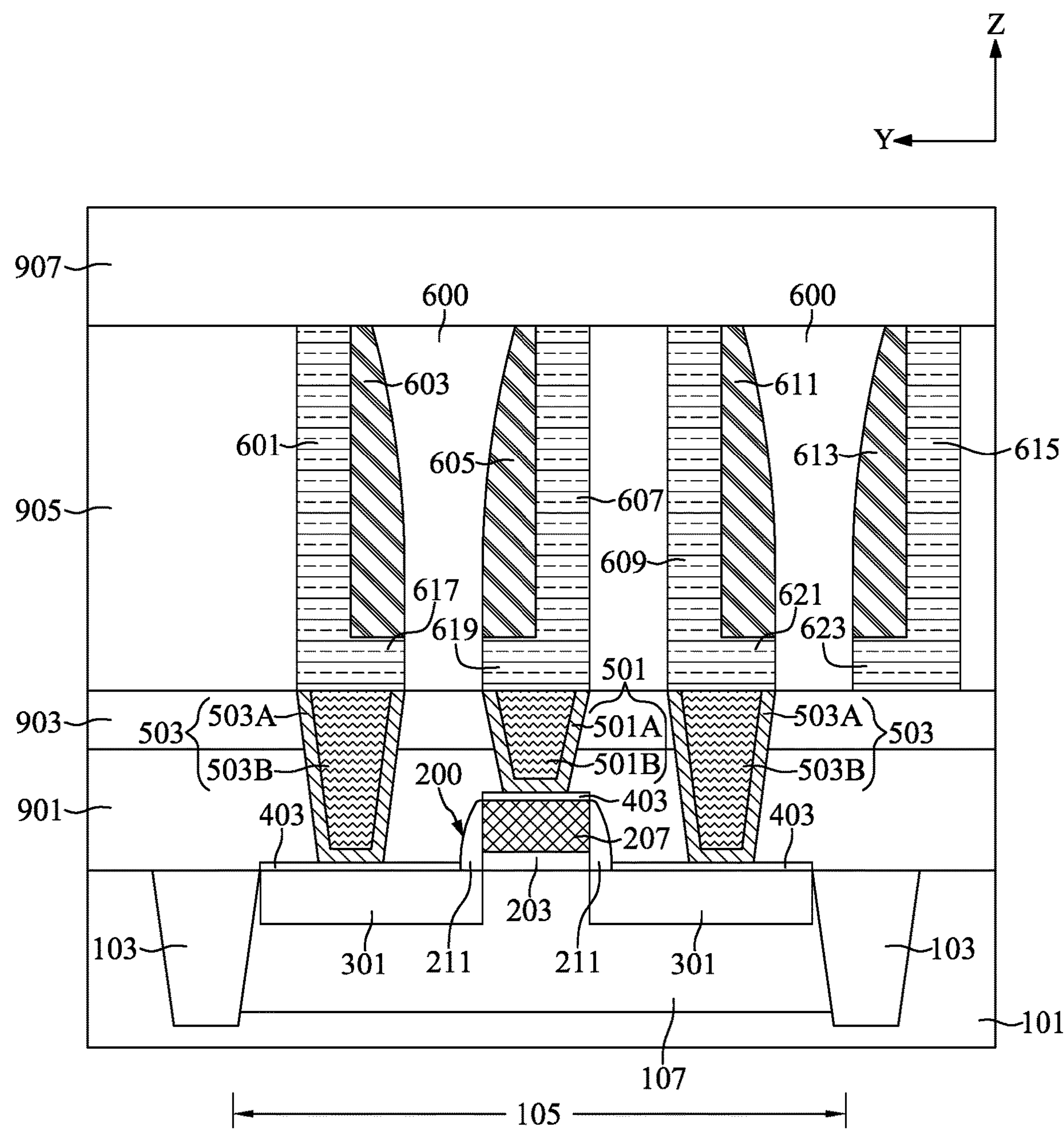

With reference to FIGS. 2 and 24, the plurality of air gaps 600 may be formed above the substrate 101. The sealing film 907 may be formed on the third insulating film 905 by deposition process same as formed the first insulating film 901. Next, the plurality of air gaps 600 may be concurrently formed after the formation of the sealing film 907.

Figure 25:
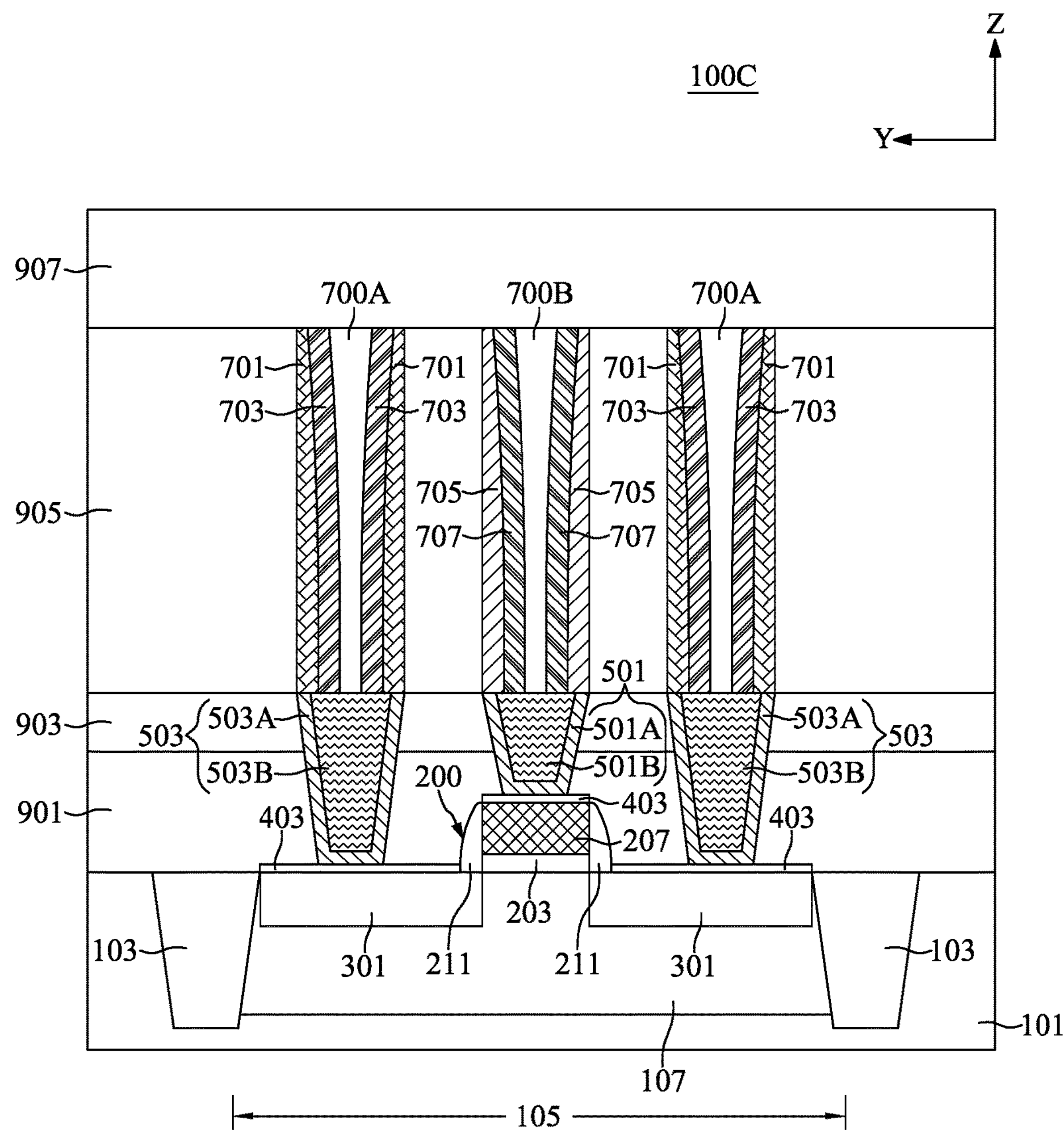
FIG. 25 illustrates, in a schematic cross-sectional view diagram, a semiconductor device in accordance with one embodiment of the present disclosure.

FIG. 25 illustrates, in a schematic cross-sectional view diagram, a semiconductor device 100C in accordance with one embodiment of the present disclosure. In the embodiment depicted, the semiconductor device 100C may include a substrate 101, a plurality of isolation structures 103, an active area 105, a plurality of doped regions 107 and 301, a word line 200, a plurality of contacts 403, a plurality of composite plugs 501 and 503, a plurality of metal spacers, a plurality of air gaps 700A and 700B, and a plurality of insulating films 901, 903, 905 and 907.

In some embodiments, the plurality of metal spacers comprise a first metal spacer 701 positioned on the composite plug 503 and a second metal spacer 703 positioned between the first metal spacer 701 and the air gap 700A over the composite plug 503. In some embodiments, a combined bottom width the first metal spacer 701, the second metal spacer 703 and the air gap 700A is equal to or greater than a top width of the composite plug 503.

In some embodiments, the plurality of metal spacers comprise a first metal spacer 705 positioned on the composite plug 501 and a second metal spacer 707 positioned between the first metal spacer 705 and the air gap 700B over the composite plug 501. In some embodiments, a combined bottom width the first metal spacer 705, the second metal spacer 707 and the air gap 700B is equal to or greater than a top width of the composite plug 501.

Figure 26:
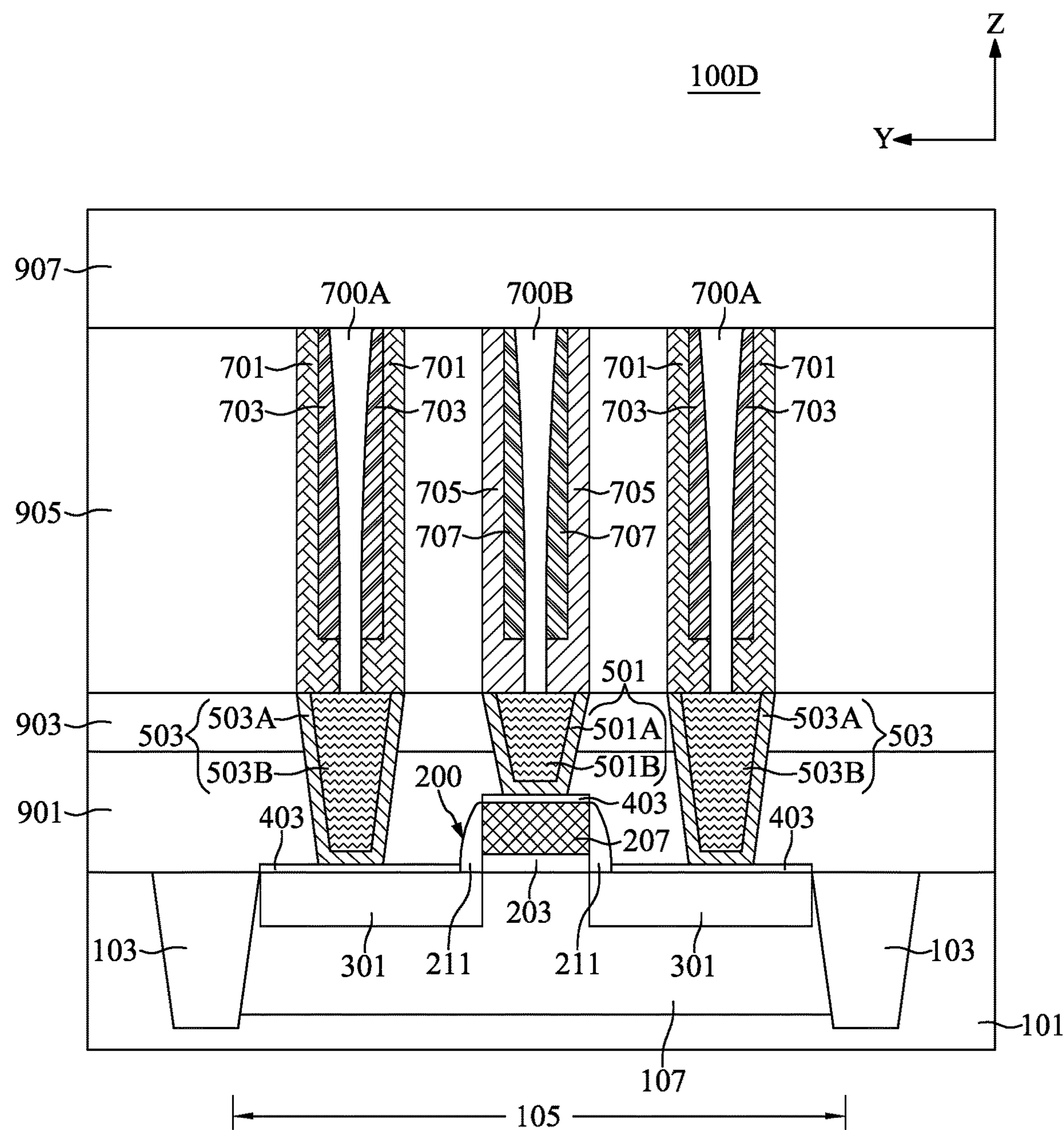
FIG. 26 illustrates, in a schematic cross-sectional view diagram, a semiconductor device in accordance with another embodiment of the present disclosure.

FIG. 26 illustrates, in a schematic cross-sectional view diagram, a semiconductor device 100D in accordance with another embodiment of the present disclosure. As compared with the semiconductor device 100C in FIG. 25, the semiconductor device 100D further comprising a first protruding portion extending from a lower portion of the first metal spacer 701 and toward to the air gap 700A, and the second metal spacer 703 is positioned on the first protruding portion. In some embodiments, a combined width of the first protruding portion and the air gap is equal to or greater than a top width of the composite plug 503.

Due to the design of the semiconductor device of the present disclosure, the plurality of metal spacers may decrease the seams and voids when filled high aspect ratio electroplated metal structure of the semiconductor device, therefore, the electrical transport performance of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:

a substrate having plurality of contacts;

a plurality of composite plugs positioned above the substrate, wherein at least one of the plurality of composite plugs includes a protection liner having a U-shaped profile and a metal plug in the protection liner, and the protection liner is in direct contact with one of the plurality of contacts;

a plurality of metal spacers positioned above the plurality of composite plugs; and, a plurality of air gaps respectively positioned between the plurality of composite plugs.

2. The semiconductor device of claim 1, wherein the plurality of metal spacers comprise a first set of metal spacers, a second set of metal spacers, a third set of metal spacers, and a fourth set of metal spacers; wherein the second set of metal spacers is positioned between the first set of metal spacers and the third set of metal spacers, and the third set of metal spacers is positioned between the second set of metal spacers and the fourth set of metal spacers.

3. The semiconductor device of claim 2, wherein the first set of metal spacers, the second set of metal spacers, and the third set of metal spacers are respectively correspondingly positioned on and electrically connected to the plurality of composite plugs.

4. The semiconductor device of claim 3, wherein the first set of metal spacers comprises a first metal spacer positioned on one of the plurality of composite plugs and a second metal spacer attached to a sidewall of the first metal spacer.

5. The semiconductor device of claim 4, wherein a combined bottom width the first metal spacer and the second metal spacer is equal to or greater than a top width of the one of the plurality of composite plugs.

6. The semiconductor device of claim 4, further comprising a first protruding portion extending from a lower portion of the first metal spacer and toward to the second set of metal spacers.

7. The semiconductor device of claim 6, wherein a width of the first protruding portion is equal to or greater than a top width of the one of the plurality of composite plugs.

8. The semiconductor device of claim 7, wherein the second metal spacer is positioned on the first protruding portion.

9. The semiconductor device of claim 6, further comprising a second protruding portion; wherein the second set of metal spacers comprises a fourth metal spacer positioned on another one of the plurality of composite plugs and a second metal spacer attached to a sidewall of the fourth metal spacer, and the second protruding portion extend from a lower portion of the fourth metal spacer and toward to the first protruding portion.

10. The semiconductor device of claim 3, further comprising a sealing film positioned above the plurality of metal spacers.

11. The semiconductor device of claim 10, wherein the sealing film has a thickness between about 1000 Angstroms and about 5000 Angstroms.

12. The semiconductor device of claim 11, wherein the plurality of air gaps are positioned below the sealing film and respectively corresponding between the first set of metal spacers and the second set of metal spacers and between the third set of metal spacers and the fourth set of metal spacers.

13. The semiconductor device of claim 3, wherein the first set of metal spacers comprises a first metal spacer and a second metal spacer attached to a sidewall of the first metal spacer, the third set of metal spacers comprises a fifth metal spacer and a sixth metal spacer attached to a sidewall of the fifth metal spacer; wherein the fifth metal spacer has a same profile as the first metal spacer and the sixth metal spacer has a same profile as the second metal spacer.

14. The semiconductor device of claim 3, wherein the fourth set of metal spacers is a dummy pattern.

15. The semiconductor device of claim 1, wherein the first set of metal spacers comprises a first metal spacer positioned on one of the plurality of composite plugs and a second metal spacer positioned between the first metal spacer and one of the plurality of air gaps.

16. The semiconductor device of claim 15, wherein a combined bottom width the first metal spacer, the second metal spacer and the air gap is equal to or greater than a top width of the one of the plurality of composite plugs.

17. The semiconductor device of claim 15, further comprising a first protruding portion extending from a lower portion of the first metal spacer and toward to the air gap.

18. The semiconductor device of claim 17, wherein a combined width of the first protruding portion and the air gap is equal to or greater than a top width of the one of the plurality of composite plugs.

19. The semiconductor device of claim 17, wherein the second metal spacer is positioned on the first protruding portion.

20. A method for fabricating a semiconductor device, comprising:

providing a substrate having a plurality of contacts;

forming a plurality of composite plugs above the substrate, wherein at least one of the plurality of composite plugs includes a protection liner having a U-shaped profile and a metal plug in the protection liner, and the protection liner is in direct contact with one of the plurality of contacts;

forming a plurality of metal spacers above the plurality of composite plugs; and, forming a plurality of air gaps positioned between the plurality of composite plugs.

* * * * *